(12) United States Patent
Jeong et al.

(10) Patent No.: US 12,740,127 B2
(45) Date of Patent: Sep. 15, 2026

(54) SEMICONDUCTOR DEVICE INCLUDING SOURCE/DRAIN PATTERN HAVING STACKING FAULT

(71) Applicant: SAMSUNG ELECTRONICS CO., LTD., Suwon-si (KR)

(72) Inventors: Soo Jin Jeong, Suwon-si (KR); Myung Gil Kang, Suwon-si (KR); Tae Gon Kim, Suwon-si (KR); Dong Won Kim, Suwon-si (KR); Ju Ri Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 496 days.

(21) Appl. No.: 18/138,877

(22) Filed: Apr. 25, 2023

(65) Prior Publication Data

US 2024/0006497 A1 Jan. 4, 2024

(30) Foreign Application Priority Data

Jun. 30, 2022 (KR) ........................ 10-2022-0080562

(51) Int. Cl.

| | |
|---|---|
| ***H10D 64/23*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |

(52) U.S. Cl.

CPC ........... *H10D 64/258* (2025.01); *H10D 30/43* (2025.01); *H10D 30/6735* (2025.01); *H10D 30/6757* (2025.01); *H10D 62/121* (2025.01); *H10D 64/017* (2025.01)

(58) Field of Classification Search

None

See application file for complete search history.

(56) References Cited

U.S. PATENT DOCUMENTS

| | | | |
|---|---|---|---|
| 8,723,266 B2 | 5/2014 | Tsai et al. | |
| 8,754,477 B2 | 6/2014 | Lu et al. | |
| 10,181,526 B2 | 1/2019 | Cantoro et al. | |
| 10,396,201 B2 | 8/2019 | Jackson et al. | |
| 10,937,787 B2 | 3/2021 | Noh et al. | |
| 11,011,620 B2 | 5/2021 | Mehandru et al. | |
| 11,024,628 B2 | 6/2021 | Noh et al. | |
| 11,233,122 B2 | 1/2022 | Kim et al. | |
| 2013/0146895 A1 | 6/2013 | Tsai et al. | |
| 2013/0328133 A1* | 12/2013 | Song | H10D 84/0128 257/392 |
| 2020/0091287 A1 | 3/2020 | Glass et al. | |

(Continued)

FOREIGN PATENT DOCUMENTS

KR 1020220080664 A 6/2022

*Primary Examiner* — Nilufa Rahim

(74) *Attorney, Agent, or Firm* — Muir Patent Law, PLLC

(57) ABSTRACT

A semiconductor device includes an active pattern having a lower pattern, and a plurality of sheet patterns spaced apart from the lower pattern in a first direction; first and second structures disposed on the lower pattern, wherein the first and second structures are arranged and spaced apart from each other in a second direction; a source/drain recess defined between first and second gate structures; and a source/drain pattern filling the source/drain recess, wherein the source/drain pattern includes a stacking fault spaced apart from the lower pattern.

20 Claims, 36 Drawing Sheets

(56) References Cited

U.S. PATENT DOCUMENTS

2021/0273099 A1 9/2021 More et al.
2021/0305388 A1* 9/2021 Lilak .................. H10D 30/6735
2022/0199618 A1* 6/2022 Jung ................. H01L 21/02381
2022/0310840 A1* 9/2022 Li ........................ H10D 30/796
2023/0052084 A1* 2/2023 Cheng .................. H10D 62/021

* cited by examiner

FIG. 26

120_HM
140p
120p
130p
ACT_L
SC_L
ACT_L
SC_L
ACT_L
SC_L
U_AP
150R_ER
150p
150R_BS
150R
BP1
100
A
A
D3
D1
D2

SEMICONDUCTOR DEVICE INCLUDING SOURCE/DRAIN PATTERN HAVING STACKING FAULT

CROSS-REFERENCE TO RELATED APPLICATION

This application claims priority from Korean Patent Application No. 10-2022-0080562, filed on Jun. 30, 2022, in the Korean Intellectual Property Office, and all the benefits accruing therefrom under 35 U.S.C. 119, the contents of which in its entirety are herein incorporated by reference.

BACKGROUND

1. Field

The present disclosure relates to a semiconductor device.

2. Description of Related Art

One of scaling techniques for increasing a density of a semiconductor device includes a multi gate transistor in which a multi-channel active pattern (or silicon body) in a shape of a fin or a nanowire is formed on a substrate and a gate is formed on a surface of the multi-channel active pattern. Because the multi-gate transistor uses a three-dimensional channel, it is easy to scale the multi-gate transistor. Further, current control ability of the multi-gate transistor may be improved without increasing a gate length of the multi-gate transistor. In addition, the multi-gate transistor may effectively suppress SCE (short channel effect) in which a potential of a channel area is affected by a drain voltage.

SUMMARY

According to an aspect of the present disclosure, there is provided a semiconductor device includes an active pattern including a lower pattern, and a plurality of sheet patterns spaced apart from the lower pattern in a first direction; first and second structures disposed on the lower pattern, wherein the first and second structures are arranged and spaced apart from each other in a second direction; a source/drain recess defined between first and second gate structures; and a source/drain pattern filling the source/drain recess, wherein the source/drain pattern includes a stacking fault spaced apart from the active pattern in the second direction.

According to another aspect of the present disclosure, there is provided a semiconductor device includes a an active pattern including a lower pattern, and a plurality of sheet patterns spaced apart from the lower pattern in a first direction; a gate structure disposed on the lower pattern, wherein the gate structure surrounds the plurality of sheet patterns, extends in a second direction, and includes a gate electrode; a source/drain recess disposed within the active pattern and on at least one side of the gate structure, wherein the source/drain recess include an extension area disposed between the lower pattern and the sheet pattern adjacent thereto in the first direction or between the sheet patterns adjacent to each other in the first direction; and a source/drain pattern filling the source/drain recess, wherein the source/drain pattern includes a stacking fault spaced from a top surface of the lower pattern, wherein a dimension in a third direction of the extension area increases and then decreases as the extension area extends away from the lower pattern.

According to still another aspect of the present disclosure, there is provided a semiconductor device includes a first active pattern including a first lower pattern, and a plurality of first sheet patterns spaced apart from the first lower pattern in a first direction; a second active pattern including a second lower pattern, and a plurality of second sheet patterns spaced apart from the second lower pattern in the first direction; a first gate structure disposed on the first lower pattern, wherein the first gate structure surrounds the plurality of first sheet patterns and extends in a second direction; a second gate structure disposed on the second lower pattern, wherein the second gate structure surrounds the plurality of second sheet patterns and extends in the second direction; a first source/drain recess disposed in the first active pattern and on at least one side of the first gate structure; a second source/drain recess disposed in the second active pattern and on at least one side of the second gate structure; a first source/drain pattern filling the first source/drain recess, wherein the first source/drain pattern includes a stacking fault non-overlapping the first lower pattern in a third direction; and a second source/drain pattern filling the second source/drain recess.

BRIEF DESCRIPTION OF DRAWINGS

Features will become apparent to those of skill in the art by describing in detail exemplary embodiments with reference to the attached drawings, in which:

FIG. 23 to FIG. 29 are diagrams of stages in a method for manufacturing a semiconductor device according to some embodiments;

DETAILED DESCRIPTION

The semiconductor device according to some embodiments may include a tunneling transistor (tunneling FET), a three-dimensional (3D) transistor, or a two-dimensional (2D) material-based FET based on a two-dimensional material, and a heterostructure thereof. Further, the semiconductor device according to some embodiments may include a bipolar junction transistor, a lateral double diffusion transistor (LDMOS), and the like.

Figure 1:
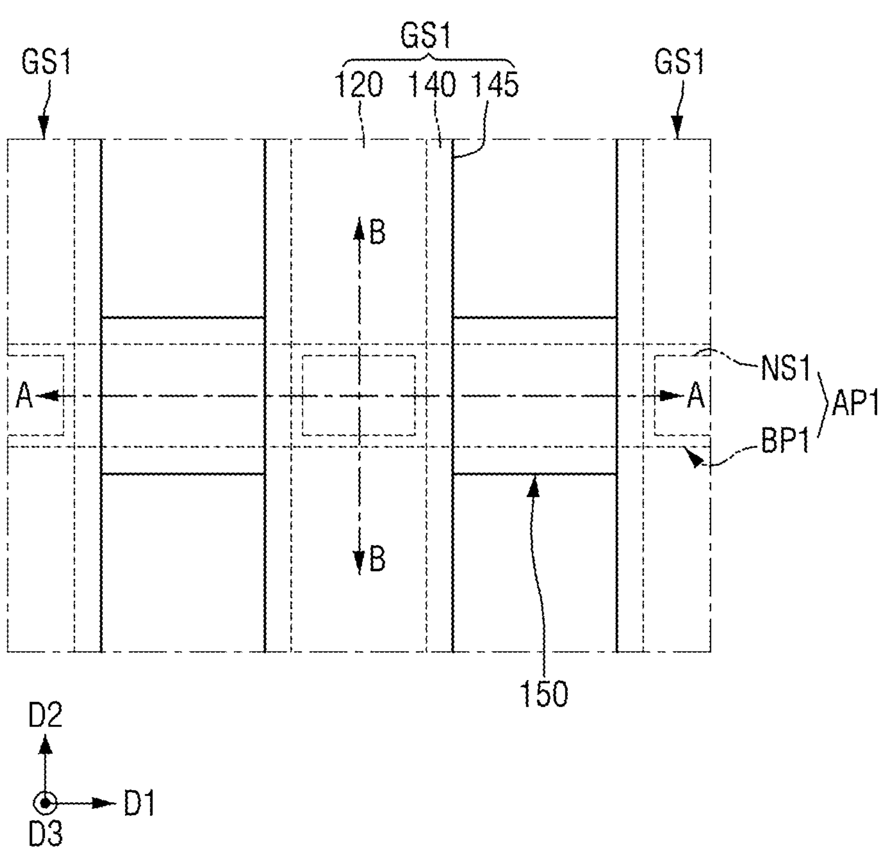
FIG. 1 is a plan view of a semiconductor device according to some embodiments.
Figure 2:
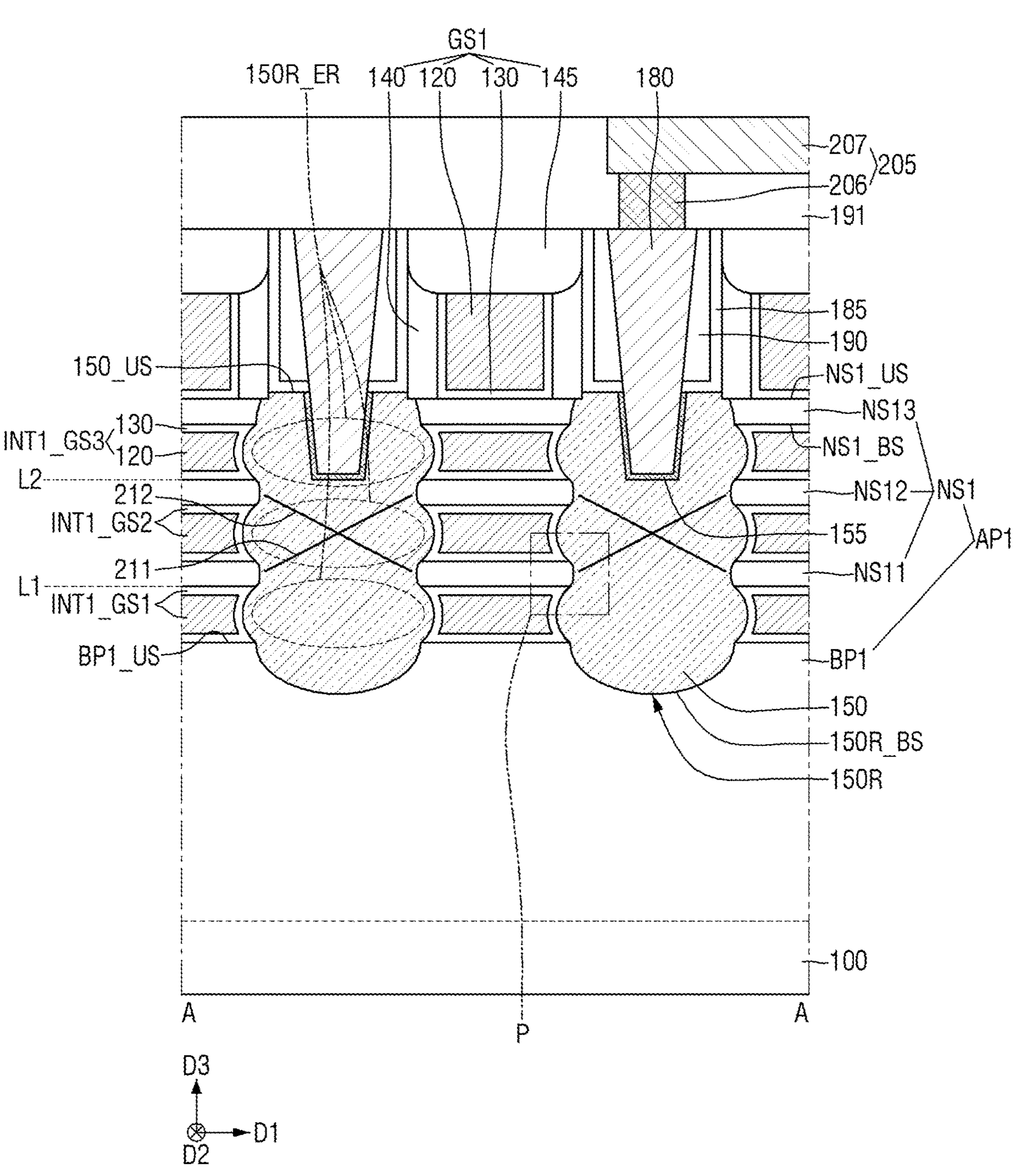
FIG. 2 is a cross-sectional view taken along line A-A of FIG. 1.
Figure 3:
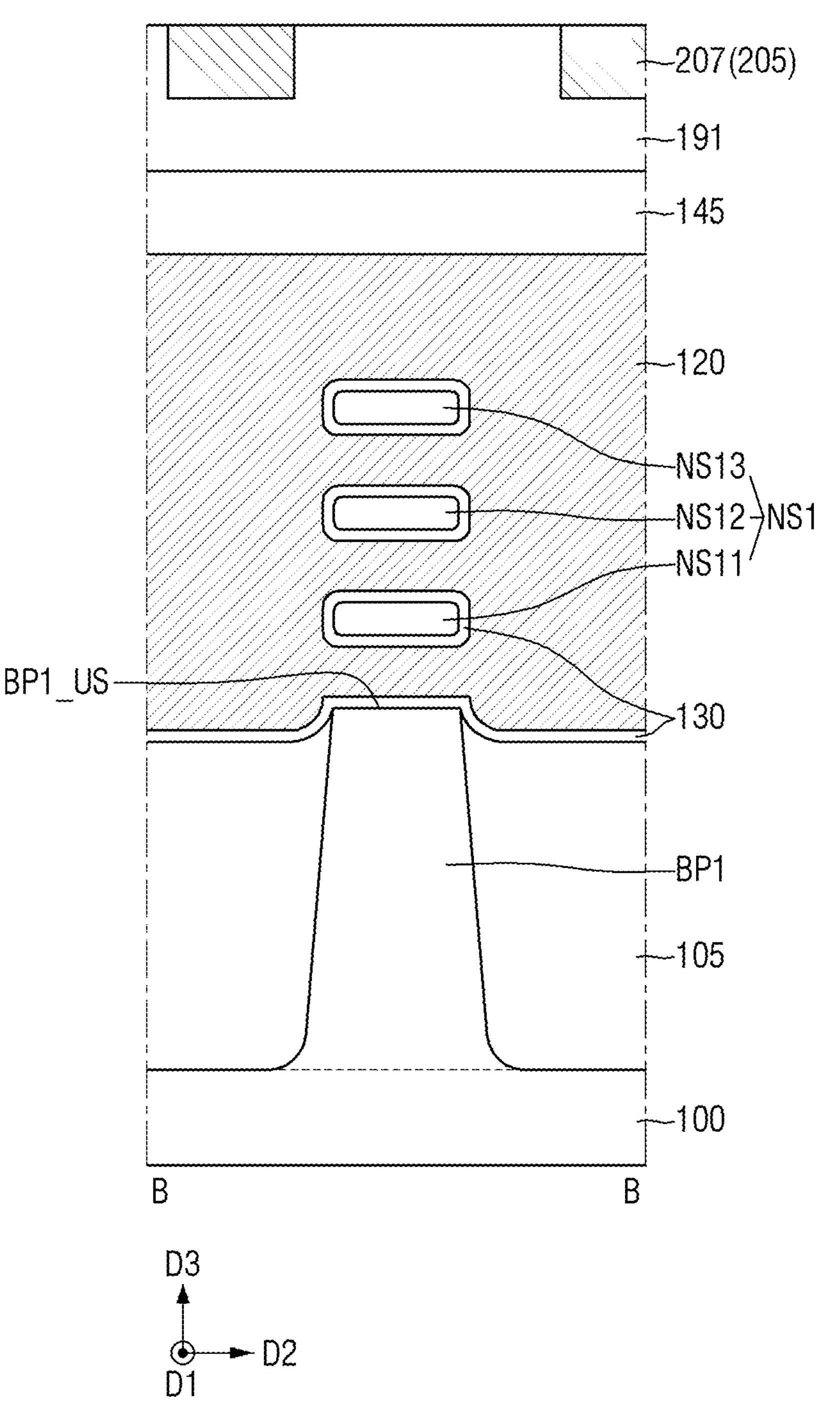
FIG. 3 is a cross-sectional view taken along line B-B of FIG. 1.
Figure 4:
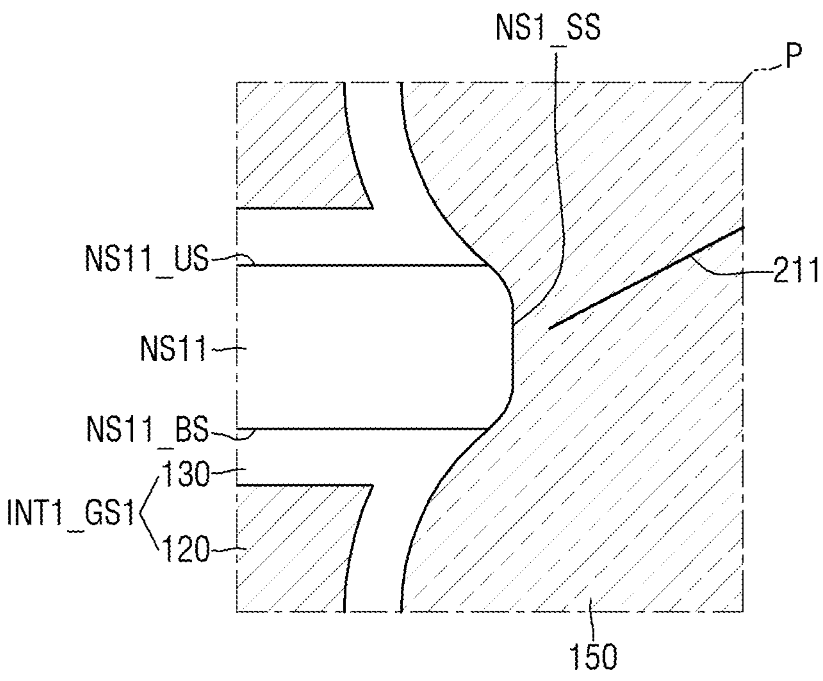
FIG. 4 to FIG. 6 are enlarged views of area P of FIG. 2.
Figure 5:
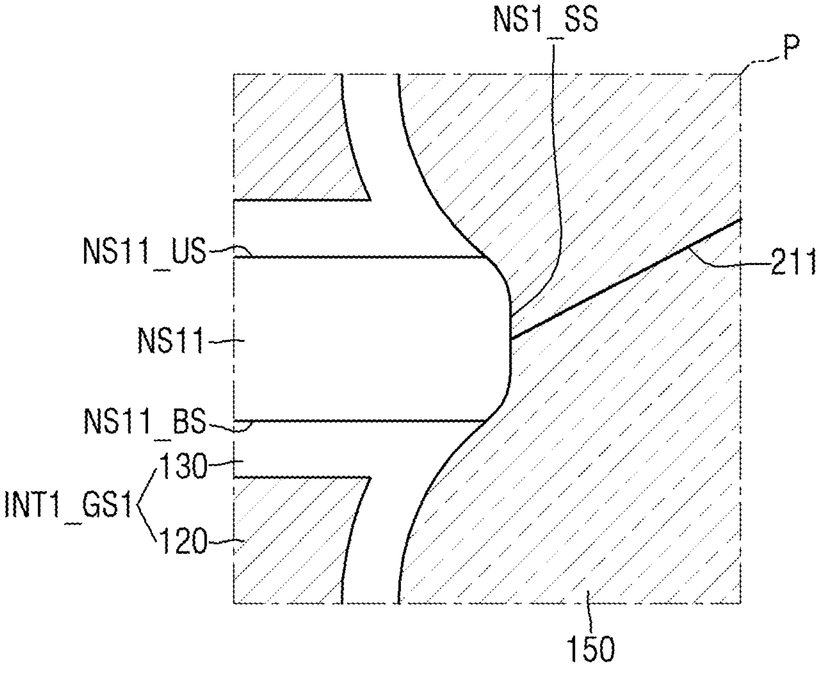
Figure 6:
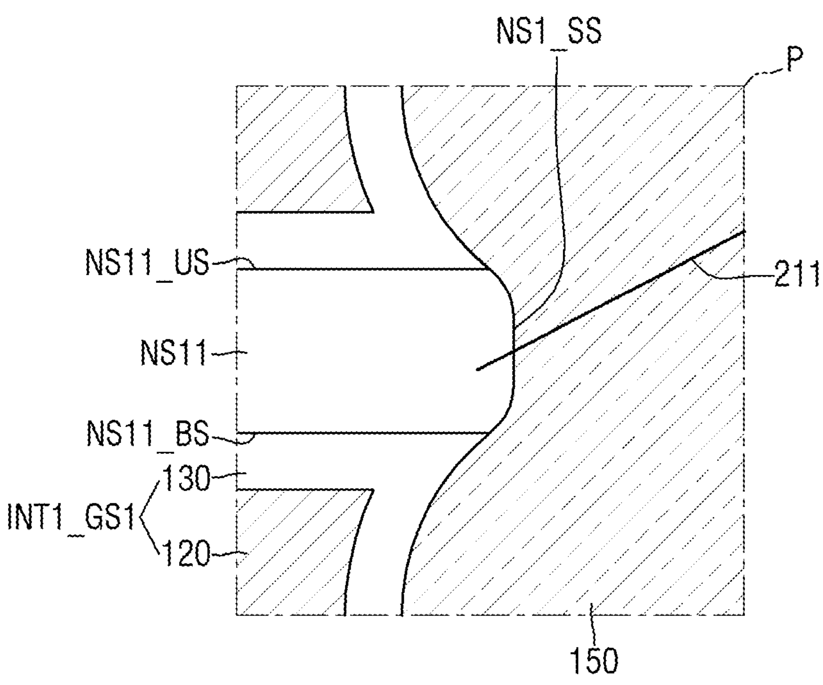

FIG. 1 is an illustrative plan view of a semiconductor device according to some embodiments. FIG. 2 is a cross-sectional view taken along line A-A of FIG. 1. FIG. 3 is a cross-sectional view taken along line B-B of FIG. 1. FIG. 4 to FIG. 6 are enlarged views of area P of FIG. 2. For reference, FIG. 1 is schematically illustrated while a first gate insulating film 130, an etch stop layer 185, a first interlayer insulating film 190, and a wiring structure 205 are omitted.

Referring to FIG. 1 to FIG. 3, a semiconductor device according to some embodiments may include a first active pattern AP1, a plurality of first gate electrodes 120, a plurality of first gate structures GS1, and a first source/drain pattern 150 on a substrate 100.

For example, the substrate 100 may be made of bulk silicon or SOI (silicon-on-insulator). In another example, the substrate 100 may be embodied as a silicon substrate, or may be made of a material other than silicon, e.g., silicon germanium, SGOI (silicon germanium on insulator), indium antimonide, lead telluride, indium arsenide, indium phosphide, gallium arsenide and/or gallium antimonide.

The first active pattern AP1 may be disposed on the substrate 100. The first active pattern AP1 may extend in an elongated manner, e.g., lengthwise, in the first direction D1.

For example, the first active pattern AP1 may be disposed in an area where a NMOS is formed. In another example, the first active pattern AP1 may be disposed in an area where a PMOS is formed.

The first active pattern AP1 may be, e.g., a multi-channel active pattern. The first active pattern AP1 may include a first lower pattern BP1 and a plurality of first sheet patterns NS1.

The first lower pattern BP1 may protrude from the substrate 100. The first lower pattern BP1 may extend in the first direction D1.

The plurality of first sheet patterns NS1 may be disposed on a top surface BP1_US of the first lower pattern. The plurality of first sheet patterns NS1 may be spaced apart from the first lower pattern BP1 in the third direction D3. The plurality of first sheet patterns NS1 may include, e.g., first-first to first-third sheet patterns NS11, NS12, and NS13 that are sequentially stacked and spaced apart from each other in the third direction D3 while being disposed on the first lower pattern BP1. Although it is illustrated that the first sheet patterns NS1 include the three sheet patterns NS11, NS12, NS13, this is only for convenience of illustration, and the first sheet patterns NS1 may include any suitable number of sheet patterns.

In this regard, the top surface BP1_US of the first lower pattern may surface, e.g., appear or face, in the third direction D3. The third direction D3 may be a direction intersecting the first direction D1 and the second direction D2. For example, the third direction D3 may be a thickness direction of the substrate 100, e.g., the third direction may be perpendicular to the top surface of the substrate 100. The first direction D1 may be a direction intersecting the second direction D2, e.g., the first and second directions D1 and D2 may be parallel to the top surface of the substrate 100.

Each of the first sheet patterns NS1 may include a top surface NS1_US and a bottom surface NS1_BS. The top surface NS1_US of the first sheet pattern is opposite to the bottom surface NS1_BS of the first sheet pattern in the third direction D3. The top surface NS1_US of the first sheet pattern may surface, e.g., face, in the third direction D3, e.g., the top surface NS1_US may face away from the substrate 100 in the third direction D3, while the bottom surface NS1_BS of the first sheet pattern may surface, e.g., face, in a direction opposite to the third direction D3, e.g., the bottom surface NS1_BS may face the substrate 100 in a direction opposite to the third direction D3.

The first lower pattern BP1 may be formed by etching a portion of the substrate 100, or may include an epitaxial layer grown from the substrate 100. The first lower pattern BP1 may include, e.g., silicon or germanium as an elemental semiconductor material. Further, the first lower pattern BP1 may include a compound semiconductor, e.g., a group IV-IV compound semiconductor or a group III-V compound semiconductor.

For example, the group IV-IV compound semiconductor may include a binary compound including two of, e.g., carbon (C), silicon (Si), germanium (Ge), and tin (Sn), a ternary compound including three thereof, or a compound obtained by doping a group IV element thereto. For example, the group III-V compound semiconductor may include a binary compound obtained by combining one of, e.g., aluminum (Al), gallium (Ga), and indium (In), as a group III element, and one of, e.g., phosphorus (P), arsenic (As), and antimony (Sb), as a group V element, with each other, a ternary compound obtained by combining two of, e.g., aluminum (Al), gallium (Ga), and indium (In), as a group III element, and one of, e.g., phosphorus (P), arsenic (As), and antimony (Sb), as a group V element, with each other, or a quaternary compound obtained by combining three of, e.g., aluminum (Al), gallium (Ga), and indium (In), as a group III element, and one of, e.g., phosphorus (P), arsenic (As), and antimony (Sb), as a group V element, with each other.

For example, the first sheet pattern NS1 may include one of silicon or germanium as an elemental semiconductor material, a group IV-IV compound semiconductor, or a group compound semiconductor. Each of the first sheet patterns NS1 may include the same material as that of the first lower pattern BP1, or may include a material other than that of the first lower pattern BP1.

A dimension of the first sheet pattern NS1 in the second direction D2 may be increased or decreased in proportion to a dimension of the first lower pattern BP1 in the second direction D2. For example, as illustrated in FIG. 3, dimensions in the second direction D2 of the first sheet patterns NS1 arranged in the third direction D3 are shown to be equal to each other. In another example, as vertical levels of the first sheet patterns NS1 based on, e.g., relative to, the first lower pattern BP1 increases, the dimensions in the second direction D2 of the first sheet patterns NS1 stacked in the third direction D3 may decrease. That is, the dimension in the second direction D2 of the topmost first sheet patterns NS1 may be the smallest.

A field insulating film 105 may be formed on the substrate 100. The field insulating film 105 may be disposed on a sidewall of the first lower pattern BP1. The field insulating film 105 is not disposed on the top surface BP1_US of the first lower pattern.

For example, as illustrated in FIG. 3, the field insulating film 105 may cover an entirety of a sidewall of the first lower pattern BP1. In another example, the field insulating film 105 may cover only a portion of a sidewall of the first lower pattern BP1. In this case, a portion of the first lower pattern BP1 may protrude in the third direction D3 upwardly beyond, e.g., above, a top surface of the field insulating film 105.

A vertical level of each of the first sheet patterns NS1 is higher than that of the top surface of the field insulating film 105. The field insulating film 105 may include, e.g., an oxide film, a nitride film, an oxynitride film, or a combination thereof. Although the field insulating film 105 is shown as a single film, this is only for convenience of illustration, e.g., the field insulating film 105 may include multiple films.

The plurality of first gate structures GS1 may be disposed on the substrate 100. Each of the first gate structures GS1 may extend in the second direction D2. The first gate structures GS1 may be disposed to be spaced apart from each other in the first direction D1. The first gate structures GS1 may be adjacent to each other in the first direction D1.

The first gate structure GS1 may be disposed on the first active pattern AP1. The first gate structure GS1 may intersect the first active pattern AP1.

The first gate structure GS1 may intersect the first lower pattern BP1. The first gate structure GS1 may surround each of the first sheet patterns NS1.

The first gate structure GS1 may include a first inner gate structure INT1_GS1, a second inner gate structure INT1_GS2, and a third inner gate structure INT1_GS3. The first inner gate structure INT1_GS1, the second inner gate structure INT1_GS2, and the third inner gate structure INT1_GS3 may be sequentially disposed on the first lower pattern BP1.

The first inner gate structure INT1_GS1 may be disposed between the first lower pattern BP1 and the first-first sheet pattern NS11. The second inner gate structure INT1_GS2 may be disposed between the first-first sheet pattern NS11 and the first-second sheet pattern NS12. The third inner gate structure INT1_GS3 may be disposed between the first-second sheet pattern NS12 and the first-third sheet pattern NS13.

The inner gate structures INT1_GS1, INT1_GS2, and INT1_GS3 are in contact with the top surface BP1_US of the first lower pattern, the top surface NS1_US of the first sheet pattern and the bottom surface NS1_BS of the first sheet pattern. The inner gate structures INT1_GS1, INT1_GS2, and INT1_GS3 include a first gate electrode 120 and the first gate insulating film 130 disposed between adjacent first sheet patterns NS1 and between the first lower pattern BP1 and the first sheet pattern NS1.

For example, as illustrated in FIG. 2, a dimension in the first direction D1 of the third inner gate structure INT1_GS3 may be equal to a dimension in the first direction D1 of the second inner gate structure INT1_GS2. A dimension in the first direction D1 of the first inner gate structure INT1_GS1 may be equal to the dimension in the first direction D1 of the second inner gate structure INT1_GS2. The dimension in the first direction D1 in each of the inner gate structures INT1_GS1, INT1_GS2, and INT1_GS3 may be measured, e.g., in a space between the top surface NS1_US of the first sheet pattern and the bottom surface NS1_BS of the first sheet pattern opposite to each other in the third direction D3.

In another example, the dimension in the first direction D1 of the first inner gate structure INT1_GS1 may be greater than the dimension in the first direction D1 of the second inner gate structure INT1_GS2. The dimension in the first direction D1 of the third inner gate structure INT1_GS3 may be equal to the dimension in the first direction D1 of the second inner gate structure INT1_GS2.

The first gate structure GS1 may include, e.g., the first gate electrode 120, the first gate insulating film 130, a first gate spacer 140, and a first gate capping pattern 145.

The first gate electrode 120 may be formed on the first lower pattern BP1. The first gate electrode 120 may intersect the first lower pattern BP1. The first gate electrode 120 may surround the first sheet pattern NS1.

The first gate electrode 120 may be disposed between the first sheet patterns NS1 adjacent to each other in the third direction D3. A portion of the first gate electrode 120 may be disposed between a top surface of the first-first sheet pattern NS11 and a bottom surface of the first-second sheet pattern NS12 facing each other, and between a top surface of the first-second sheet pattern NS12 and a bottom surface of the first-third sheet pattern NS13 facing each other. Further, a portion of the first gate electrode 120 may be disposed between the top surface BS1_US of the first lower pattern and the bottom surface of the first-first sheet pattern NS11.

The first gate electrode 120 may include at least one of a metal, a metal alloy, a conductive metal nitride, a metal silicide, a doped semiconductor material, a conductive metal oxide, and a conductive metal oxynitride. The first gate electrode 120 may include at least one of, e.g., titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC-N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and combinations thereof. The conductive metal oxide and the conductive metal oxynitride may include oxidized products of the above-mentioned materials.

The first gate electrode 120 may be disposed on each of both opposing sides of the first source/drain pattern 150 to be described later. The first gate structure GS1 may be disposed on each of both opposing sides opposite to each other in the first direction D1 of the first source/drain pattern 150.

In one example, each of the first gate electrodes 120 disposed on each of both opposing sides of the first source/drain pattern 150 may be embodied as a normal, e.g., operating, gate electrode used as a gate of a transistor. In another example, the first gate electrode 120 disposed on one side of the first source/drain pattern 150 may be used as a gate of the transistor, while the first gate electrode 120 disposed on the other side of the first source/drain pattern 150 may act as a dummy gate electrode.

The first gate insulating film 130 may extend along and on a top surface of the field insulating film 105 and the top surface BP1_US of the first lower pattern. The first gate insulating film 130 may surround the plurality of first sheet patterns NS1. The first gate insulating film 130 may be disposed along a circumference of the first sheet pattern NS1. The first gate electrode 120 is disposed on the first gate insulating film 130. The first gate insulating film 130 is disposed between the first gate electrode 120 and the first sheet pattern NS1. The first gate insulating film 130 may be disposed between the first-first sheet pattern NS11 and the first-second sheet pattern NS12 adjacent to each other in the third direction D3, between the first-second sheet pattern NS12 and the first-third sheet pattern NS13 adjacent to each other in the third direction D3, and between the first lower pattern BP1 and the first-first sheet pattern NS11 adjacent to each other in the third direction D3.

The first gate insulating film 130 may include silicon oxide, silicon-germanium oxide, germanium oxide, silicon oxynitride, silicon nitride, or a high dielectric constant material having a higher dielectric constant than that of silicon oxide. The high dielectric constant material may include at least one of, e.g., boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate. However, the present disclosure is not limited thereto.

Although it is illustrated that the first gate insulating film 130 is embodied as a single film, this is only for convenience of illustration, and the present disclosure is not limited thereto. The first gate insulating film 130 may include a plurality of films. The first gate insulating film 130 may include a high dielectric constant insulating film, and an interfacial film disposed between the first sheet pattern NS1 and the first gate electrode 120.

The semiconductor device according to some embodiments may include an NC (negative capacitance) FET using a negative capacitor. In one example, the first gate insulating film 130 may include a ferroelectric material film having ferroelectric characteristics and a paraelectric material film having paraelectric characteristics.

The ferroelectric material film may have negative capacitance, and the paraelectric material film may have positive capacitance. For example, when two or more capacitors are connected in series to each other, and capacitance of each of the capacitors has a positive value, a total capacitance is smaller than capacitance of each individual capacitor. On the contrary, when at least one of capacitances of two or more capacitors connected in series to each other has a negative value, a total capacitance may have a positive value and be greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may be increased. Using the increase in the total capacitance value, a transistor including the ferroelectric material film may have a subthreshold swing (SS) lower than about 60 mV/decade at room temperature.

The ferroelectric material film may have ferroelectric properties. The ferroelectric material film may include, e.g., at least one of hafnium oxide, hafnium zirconium oxide, barium strontium titanium oxide, barium titanium oxide, and lead zirconium titanium oxide. In this connection, in one example, hafnium zirconium oxide may refer to a material obtain by doping hafnium oxide with zirconium (Zr). In another example, hafnium zirconium oxide may refer to a compound of hafnium (Hf), zirconium (Zr), and oxygen (O).

The ferroelectric material film may further contain dopants. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn). A type of the dopant contained in the ferroelectric material film may vary depending on a type of the ferroelectric material included in the ferroelectric material film.

When the ferroelectric material film includes hafnium oxide, the dopant contained in the ferroelectric material film may include, e.g., at least one of gadolinium (Gd), silicon (Si), zirconium (Zr), aluminum (Al), and yttrium (Y).

When the dopant is aluminum (Al), the ferroelectric material film may contain about 3 at % to about 8 at % (atomic %) of aluminum. In this connection, a content of the dopant may be a content of aluminum based on a sum of hafnium and aluminum.

When the dopant is silicon (Si), the ferroelectric material film may contain about 2 at % to about 10 at % of silicon. When the dopant is yttrium (Y), the ferroelectric material film may contain about 2 at % to about 10 at % yttrium. When the dopant is gadolinium (Gd), the ferroelectric material film may contain about 1 at % to about 7 at % gadolinium. When the dopant is zirconium (Zr), the ferroelectric material film may contain about 50 at % to about 80 at % zirconium.

The paraelectric material film may have paraelectric properties. The paraelectric material film may include, e.g., at least one of silicon oxide and metal oxide having a high dielectric constant. For example, the metal oxide contained in the paraelectric material film may include, e.g., at least one of hafnium oxide, zirconium oxide and aluminum oxide.

The ferroelectric material film and the paraelectric material film may include the same material. The ferroelectric material film may have ferroelectric properties, but the paraelectric material film may not have the ferroelectric properties. For example, when each of the ferroelectric material film and the paraelectric material film includes hafnium oxide, a crystal structure of hafnium oxide contained in the ferroelectric material film is different from a crystal structure of hafnium oxide contained in the paraelectric material film.

The ferroelectric material film may have a thickness sized to exhibit ferroelectric properties. For example, the thickness of the ferroelectric material film may be, e.g., in a range of about 0.5 nm to about 10 nm. Because a critical thickness exhibiting the ferroelectric properties may vary based on a type of the ferroelectric material, the thickness of the ferroelectric material film may vary depending on the type of the ferroelectric material.

In one example, the first gate insulating film 130 may include one ferroelectric material film. In another example, the first gate insulating film 130 may include a plurality of ferroelectric material films spaced apart from each other. The first gate insulating film 130 may have a stack film structure in which a plurality of ferroelectric material films and a plurality of paraelectric material films are alternately stacked on top of each other.

The first gate spacer 140 may be disposed on a sidewall of the first gate electrode 120. The first gate spacer 140 may not be disposed between the first lower pattern BP1 and the first sheet pattern NS1 and between the first sheet patterns NS1 adjacent to each other in the third direction D3. In the semiconductor device according to some embodiments, the first gate spacer 140 may include only an outer spacer.

The first gate spacer 140 may include, e.g., at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), and combinations thereof. Although the first gate spacer 140 is shown as a single film, this is only for convenience, e.g., the first gate spacer 140 may include multiple films.

The first gate capping pattern 145 may be disposed on the first gate electrode 120 and the first gate spacer 140. A top surface of the first gate capping pattern 145 may be coplanar with a top surface of the first interlayer insulating film 190. Unlike what is shown, the first gate capping pattern 145 may be disposed between, e.g., facing side surfaces of, the first gate spacers 140.

The first source/drain pattern 150 may be disposed on the first active pattern AP1. The first source/drain pattern 150 may be disposed on the first lower pattern BP1. The first source/drain pattern 150 is connected to the first sheet pattern NS1. The first source/drain pattern 150 contacts the first sheet pattern NS1.

The first source/drain pattern 150 may be disposed on at least one side surface of the first gate structure GS1. The first source/drain pattern 150 may be disposed between the first gate structures GS1 adjacent to each other in the first direction D1. For example, the first source/drain pattern 150 may be disposed on each of both opposing sides of the first gate structure GS1. Unlike what is shown, the first source/drain pattern 150 may be disposed on one side of the first gate structure GS1, and may not be disposed on the other side of the first gate structure GS1.

The first source/drain pattern 150 may be included in a source/drain of a transistor using the first sheet pattern NS1 as a channel area thereof.

The first source/drain pattern 150 may be disposed in a first source/drain recess 150R. The first source/drain pattern 150 may fill the first source/drain recess 150R.

The first source/drain recess 150R extends in the third direction D3. The first source/drain recess 150R may be defined between the first gate structures GS1 adjacent to each other in the first direction D1.

A bottom surface 150R_BS of the first source/drain recess 150R is defined by the first lower pattern BP1. The bottom surface 150R_BS of the first source/drain recess may face in a direction opposite to the third direction D3. A sidewall of the first source/drain recess 150R may be defined by the first sheet pattern NS1 and the inner gate structures INT1_GS1, INT1_GS2, and INT1_GS3. The inner gate structures INT1_GS1, INT1_GS2, and INT1_GS3 may define a portion of the sidewall of the first source/drain recess 150R.

In an area between the first-first sheet pattern NS11 and the first lower pattern BP1, a boundary between the first gate insulating film 130 and the first lower pattern BP1 may be the top surface BP1_US of the first lower pattern. The top surface BP1_US of the first lower pattern may be a boundary between the first inner gate structure INT1_GS1 and the first lower pattern BP1. A vertical level of the bottom surface 150R_BS of the first source/drain recess 150R is lower than that of the top surface BP1_US of the first lower pattern, e.g., relative to a bottom surface of the substrate 100.

A sidewall of the first source/drain recess 150R may have a wavy shape, e.g., the first source/drain pattern 150 filling the first source/drain recess 150R and contacting the wavy sidewalls of the first source/drain recess 150R may have concave portions facing (e.g., contacting) the inner gate structures INT1_GS1, INT1_GS2, and INT1_GS3. The first source/drain recess 150R may include a plurality of width extension areas 150R_ER. The width extension area 150R_ER of each of the first source/drain recesses may be defined above the top surface BP1_US of the first lower pattern, e.g., the width extension areas 150R_ER may correspond to and be filled by the concave portions of the first source/drain pattern 150.

The width extension area 150R_ER of the first source/drain recess may be defined between adjacent ones of the first sheet patterns NS1 adjacent to each other in the third direction D3. The width extension area 150R_ER of the first source/drain recess may be defined between the first lower pattern BP1 and the first-first sheet pattern NS11. The width extension area 150R_ER of the first source/drain recess may extend into a space between the first sheet patterns NS1 adjacent to each other in the third direction D3. The width extension area 150R_ER of the first source/drain recess may be defined between adjacent ones of the inner gate structures INT1_GS1, INT1_GS2, and INT1_GS3 adjacent to each other in the first direction D1.

The width extension area 150R_ER of each of the first source/drain recesses may have a portion whose a dimension in the first direction D1 increases, and a portion whose a dimension in the first direction D1 decreases as the width extension area ER of each of the first source/drain recesses extends away from the top surface BP1_US of the first lower pattern. For example, as the width extension area 150R_ER of each of the first source/drain recesses extends away from the top surface BP1_US of the first lower pattern, the dimension in the first direction D1 of the width extension area 150R_ER of the first source/drain recess may increase and then decrease. In the width extension area 150R_ER of each of the first source/drain recesses, a point at which the dimension in the first direction D1 of the width extension area 150R_ER of the first source/drain recess is maximum may be positioned between the first-first sheet pattern NS11 and the first lower pattern BP1, or between adjacent ones of the first sheet patterns NS1 adjacent to each other in the third direction D3.

The first source/drain pattern 150 may be in, e.g., direct, contact with the first sheet pattern NS1 and the first lower pattern BP1. The first gate insulating film 130 of the inner gate structures INT1_GS1, INT1_GS2, and INT1_GS3 may, e.g., directly, contact the first source/drain pattern 150.

The first source/drain pattern 150 may include an epitaxial pattern. The first source/drain pattern 150 may include a semiconductor material.

The first source/drain pattern 150 may include, e.g., silicon or germanium as an elemental semiconductor material. Further, the first source/drain pattern 150 may include, e.g., a binary compound including two of carbon (C), silicon (Si), germanium (Ge), and tin (Sn), a ternary compound including three thereof, or the binary compound or the ternary compound containing a group IV element doped thereto. For example, the first source/drain pattern 150 may include silicon, silicon-germanium, silicon carbide, etc.

The first source/drain pattern 150 may include impurity doped semiconductor material. For example, the first source/drain pattern 150 may contain n-type impurity. The doped n-type impurity may include at least one of, e.g., phosphorus (P), arsenic (As), antimony (Sb), and bismuth (Bi). Although it is illustrated that the first source/drain pattern 150 is embodied as a single film, this is only for convenience of illustration, e.g., the first source/drain pattern 150 may include multiple films. The first source/drain pattern 150 may include a first stacking fault 211 and 212.

The first stacking fault 211 and 212 may apply stress to the first sheet pattern NS1 used as a channel area. Accordingly, mobility of charge carriers in the first sheet pattern NS1 may be increased to improve performance of the semiconductor device. The first stacking fault refers to a crystallographic defect, e.g., a line defect or a dislocation.

The first stacking fault 211 and 212 may be spaced apart from the bottom surface 150R_BS of the first source/drain recess, e.g., in the third direction D3. The first stacking fault 211 and 212 may be spaced apart from the top surface BP1_US of the first lower pattern, e.g., in the third direction D3. The first stacking fault 211 and 212 may not contact the first lower pattern BP1. The first stacking fault 211 and 212 may not overlap, e.g., the first lower pattern BP1 in the first direction D1. In some embodiments, the first stacking fault 211 and 212 may be disposed between an extension line L1 of a bottom surface of the first-first sheet pattern NS11 and an extension line L2 of a top surface of the first-second sheet pattern NS12.

In some embodiments, the first stacking fault 211 and 212 may have a first-first stacking fault 211 having a positive slope relative to the top surface BP1_US of the first lower pattern, and a first-second stacking fault 212 having a negative slope relative to the top surface BP1_US of the first lower pattern. For example, the first-first stacking fault 211 may extend from a sidewall of the first-first sheet pattern NS11 or a point spaced from the sidewall of the first-first sheet pattern NS11 in an inclined manner toward the top surface 150_US of the first source/drain pattern. The first-second stacking fault 212 may extend from a sidewall of the first-second sheet pattern NS12 or a point spaced from the sidewall of the first-second sheet pattern NS12 in an inclined manner toward the bottom surface 150R_BS of the first source/drain recess or the top surface BP1_US of the first lower pattern.

In some embodiments, the first stacking fault 211 and 212 may extend from the sidewall of the first sheet pattern NS11, a point spaced apart from the sidewall of the first sheet pattern NS11, or an inner point of the first sheet pattern NS11. The first stacking fault 211 and 212 may start to extend from the sidewall of the first sheet pattern NS11, a point adjacent to the sidewall of the first sheet pattern NS11, or an inner point of the first sheet pattern NS11.

In some embodiments, the first stacking fault 211 and 212 may be spaced apart from the sidewall of the first sheet pattern NS1. The first stacking fault 211 and 212 may not contact the sidewall of the first sheet pattern NS1. The first stacking fault 211 and 212 may extend from a point spaced apart from the sidewall of the first sheet pattern NS1. The first stacking fault 211 and 212 may extend from a point spaced apart from the sidewall of the first sheet pattern NS1 in an inclined manner toward the top surface 150_US of the first source/drain pattern or the bottom surface 150R_BS of the first source/drain recess. For example, referring to FIG. 4, the first-first stacking fault 211 may extend from a point within the first source/drain pattern 150 and spaced from the sidewall NS1_SS of the first-first sheet pattern NS11 in an inclined manner toward the top surface 150_US of the first source/drain pattern.

In some embodiments, the first stacking fault 211 and 212 may extend from a sidewall of the first sheet pattern NS1. The first stacking fault 211 and 212 may, e.g., directly, contact the sidewall of the first sheet pattern NS1. The first stacking fault 211 and 212 may extend from the sidewall of the first sheet pattern NS1 in an inclined manner toward the top surface 150_US of the first source/drain pattern or the bottom surface 150R_BS of the first source/drain recess 150R. For example, referring to FIG. 5, the first-first stacking fault 211 may extend from the sidewall NS1_SS of the first-first sheet pattern NS11 in an inclined manner toward the top surface 150_US of the first source/drain pattern.

In some embodiments, the first stacking fault 211 and 212 may extend from an inner point of the first sheet pattern NS1. That is, the first stacking fault 211 and 212 may extend to an inner point of the first sheet pattern NS1. A portion of the first stacking fault 211 and 212 may be disposed inside the first sheet pattern NS1. The first stacking fault 211 and 212 may extend from the inner point of the first sheet pattern NS1 in an inclined manner toward the top surface 150_US of the first source/drain pattern or the bottom surface 150R_BS of the first source/drain recess. For example, referring to FIG. 6, the first-first stacking fault 211 may extend from the inner point of the first-first sheet pattern NS11 in an inclined manner toward the top surface 150_US of the first source/drain pattern.

In some embodiments, the first-first stacking fault 211 and the first-second stacking fault 212 may meet each other, e.g., may directly contact each other. The first-first stacking fault 211 and the first-second stacking fault 212 may intersect each other. The first-first stacking fault 211 and the first-second stacking fault 112 may interest each other to form, e.g., an "X" shape. The first-first stacking fault 211 may extend from a point spaced apart from the sidewall of the first-first sheet pattern NS11 or from the sidewall of the first-first sheet pattern NS11 and may extend through a contact point thereof with the first-second stacking fault 212, and then may extend toward the top surface 150_US of the first source/drain pattern. The first-second stacking fault 212 may extend from a point spaced apart from the sidewall of the first-second sheet pattern NS12 or from the sidewall of the first-second sheet pattern NS12 and then may extend through the contact point thereof with the first-first stacking fault 211 and then may extend toward the bottom surface 150R_BS of the first source/drain recess.

The source/drain etch stop layer 185 may be disposed on a sidewall of the first gate structure GS1, a top surface of the first source/drain pattern 150, a sidewall of the first source/drain pattern 150, and a top surface of the field insulating film 105. The source/drain etch stop layer 185 may include a material having an etch selectivity relative to the first interlayer insulating film 190 to be described later.

The source/drain etch stop layer 185 may include, e.g., at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), and combinations thereof. Unlike what is illustrated, the source/drain etch stop layer 185 may not be formed.

The first interlayer insulating film 190 may be disposed on the source/drain etch stop layer 185. The first interlayer insulating film 190 may be disposed on the first source/drain pattern 150. The first interlayer insulating film 190 may not cover a top surface of the first gate capping pattern 145. For example, the top surface of the first interlayer insulating film 190 may be coplanar with the top surface of the first gate capping pattern 145.

The first interlayer insulating film 190 may include, e.g., at least one of silicon oxide, silicon nitride, silicon oxynitride, and a low dielectric constant (low-k) material. The low dielectric constant material may include, e.g., fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), TOSZ (Tonen SilaZen), FSG (fluoride silicate glass), polyimide nanofoams, e.g., polypropylene oxide, CDO (carbon doped silicon oxide), OSG (organo silicate glass), SiLK, amorphous fluorinated carbon, silica aerogels, silica xerogels, mesoporous silica, or a combination thereof.

A first source/drain contact 180 is disposed on the first source/drain pattern 150. The first source/drain contact 180 is connected to the first source/drain pattern 150. The first source/drain contact 180 may extend through the first interlayer insulating film 190 and source/drain etch stop layer 185 and then may be connected to the first source/drain pattern 150. A first metal silicide film 155 may be further disposed between the first source/drain contact 180 and the first source/drain pattern 150.

Although it is illustrated that the first source/drain contact 180 is embodied as a single film, this is only for convenience of illustration, e.g., the first source/drain contact 180 may be embodied as multiple films. The first source/drain contact 180 may include, e.g., at least one of metal, metal alloy, conductive metal nitride, conductive metal carbide, conductive metal oxide, conductive metal carbonitride, and a two-dimensional material (2D material). The first metal silicide film 155 may include metal silicide.

A second interlayer insulating film 191 is disposed on the first interlayer insulating film 190. The second interlayer insulating film 191 may include, e.g., at least one of silicon oxide, silicon nitride, silicon oxynitride, and a low-k material.

A wiring structure 205 is disposed in the second interlayer insulating film 191. The wiring structure 205 may be connected to the first source/drain contact 180. The wiring structure 205 may include a wiring line 207 and a wiring via 206.

Although it is illustrated that the wiring line 207 and the wiring via 206 are distinguished from each other, this is only for convenience of illustration, e.g., the wiring line 207 and the wiring via 206 may be integral with each other. For example, the wiring via 206 may be formed, and then the wiring line 207 may be formed, e.g., of different materials and/or by different processes. In another example, the wiring via 206 and the wiring line 207 may be formed simultaneously, e.g., in a same process of a same material.

Although it is illustrated that each of the wiring line 207 and the wiring via 206 is embodied as a single film, this is only for convenience of illustration, e.g., each of the wiring line 207 and the wiring via 206 may be embodied as multiple films. Each of the wiring line 207 and the wiring via 206 may include, e.g., at least one of metal, metal alloy, conductive metal nitride, conductive metal carbide, conductive metal oxide, conductive metal carbonitride, and a two-dimensional material (2D material).

For example, a top surface of a portion of the first source/drain contact 180 connected to the wiring structure 205 may be coplanar with a top surface of a portion of the first source/drain contact 180 not connected to the wiring structure 205.

FIG. 7 to FIG. 20 are cross-sectional views of a semiconductor device according to some embodiments. For reference, FIG. 7 to FIG. 20 are cross-sectional views taken along line A-A of FIG. 1. For convenience of description, the following descriptions are based on differences relative to those with respect to FIG. 1 to FIG. 6.

Figure 7:
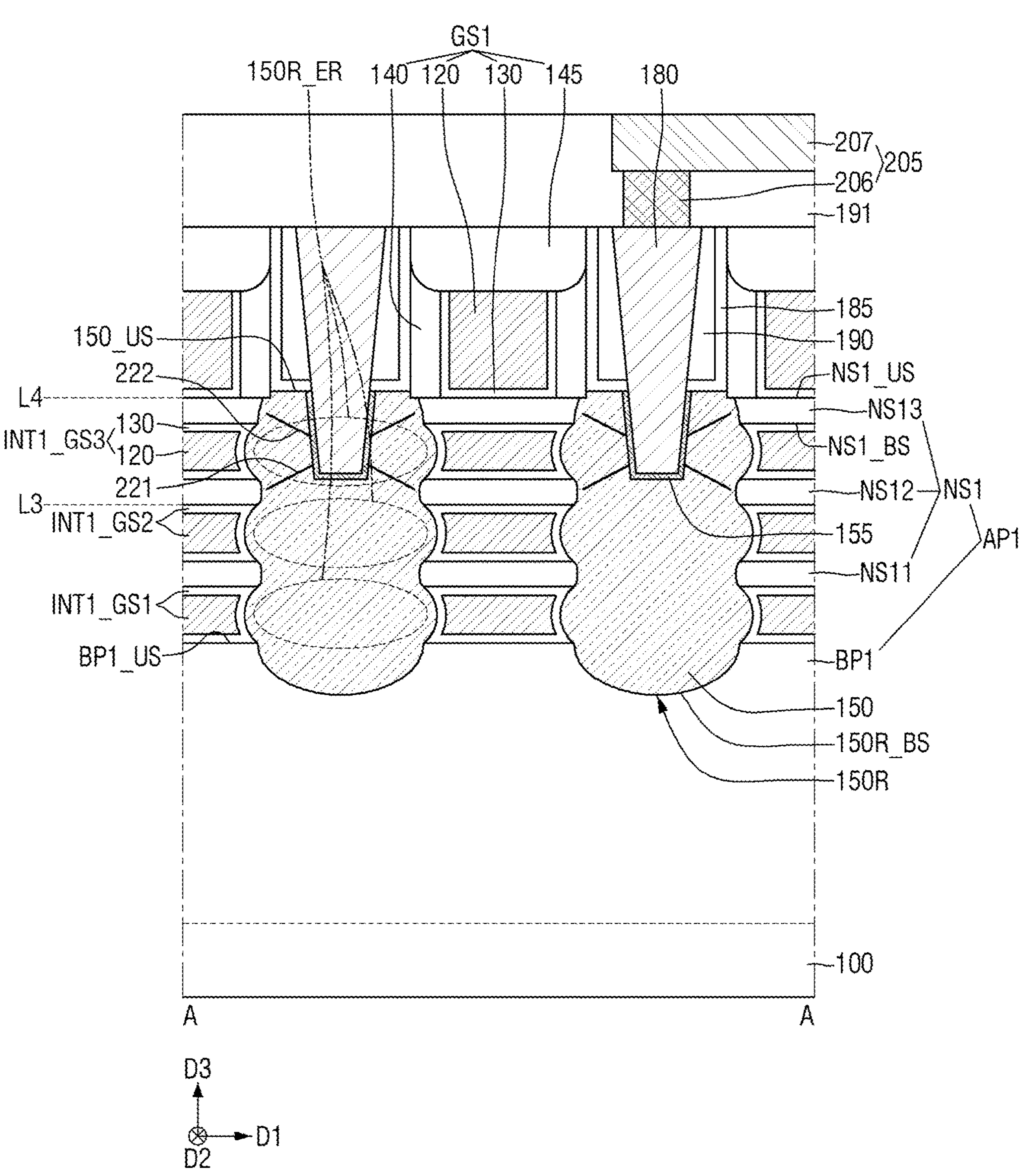
FIG. 7 to FIG. 20 are cross-sectional views of a semiconductor device according to some embodiments.

Referring to FIG. 7, in the semiconductor device according to some embodiments, the first source/drain pattern 150 may include a second stacking fault 221 and 222. The second stacking fault 221 and 222 may be disposed between an extension line L3 of a bottom surface of the first-second sheet pattern NS12 and an extension line L4 of a top surface of the first-third sheet pattern NS13. In some embodiments, the second stacking fault 221 and 222 may include a second-first stacking fault 221 with a positive slope relative to the top surface BP1_US of the first lower pattern, and a second-second stacking fault 222 with a negative slope relative to the top surface BP1_US of the first lower pattern.

For example, the second-first stacking fault 221 may extend from a point spaced apart from the sidewall of the first-second sheet pattern NS12 or from the sidewall of the first-second sheet pattern NS12 in an inclined manner toward the top surface 150_US of the first source/drain pattern. The second-second stacking fault 222 may extend from a point spaced from the sidewall of the first-third sheet pattern NS13 or from the sidewall of the first-third sheet pattern NS13 in an inclined manner toward the bottom surface BS of the first source/drain recess.

Figure 8:
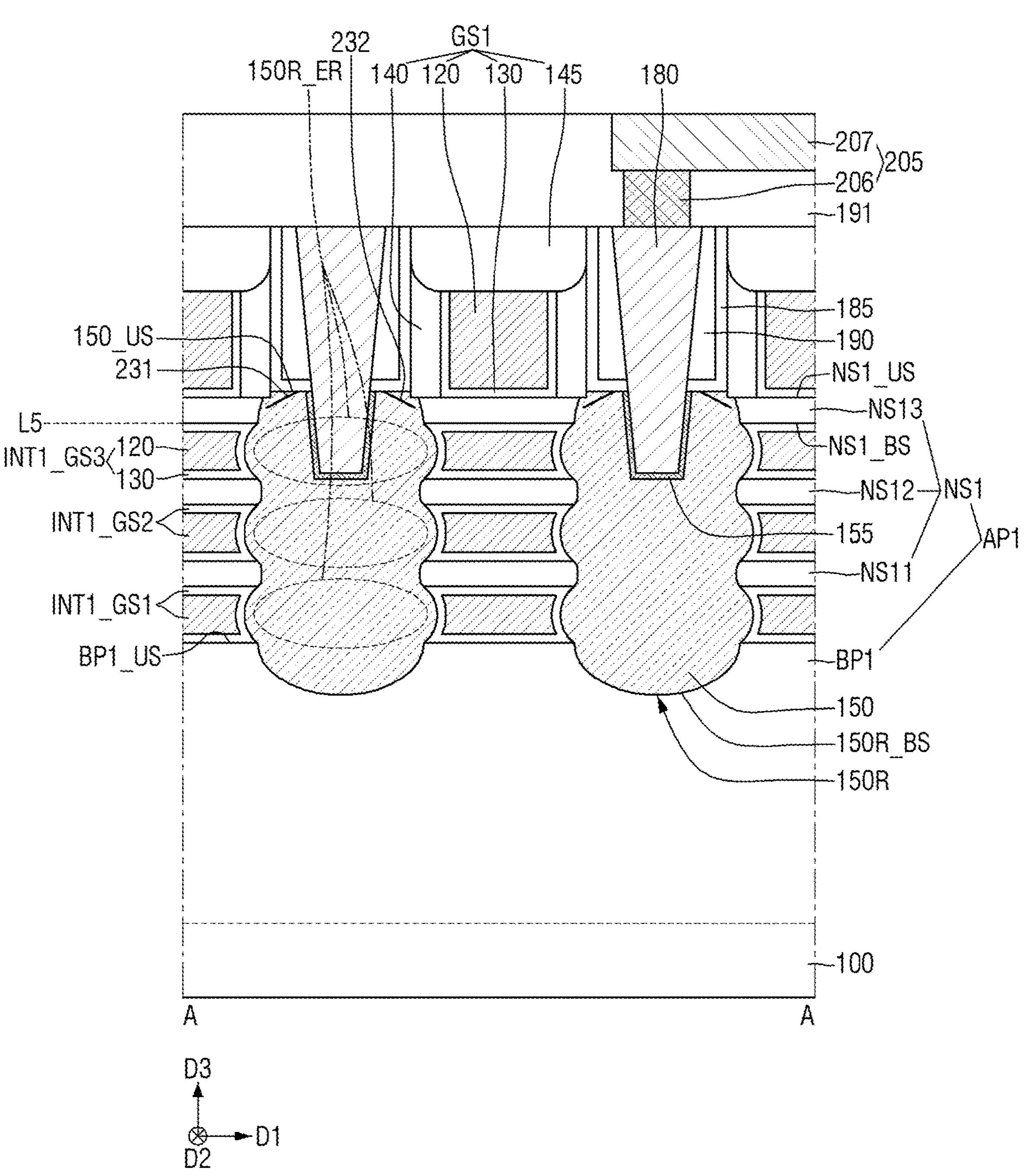

Referring to FIG. 8, in the semiconductor device according to some embodiments, the first source/drain pattern 150 may include a third stacking fault 231 and 232. The third stacking fault 231 and 232 may be disposed between an extension line L5 of a bottom surface of the first-third sheet pattern NS13 and the top surface 150_US of the first source/drain pattern. In some embodiments, the third stacking fault 231 and 232 may include a third-first stacking fault 231 having a positive slope relative to the top surface BP1_US of the first lower pattern and a third-second stacking fault 232 having a negative slope relative to the top surface BP1_US of the first lower pattern.

For example, the third-first stacking fault 231 may extend from a point spaced away from the sidewall of the first-third sheet pattern NS13 or from the sidewall of the first-third sheet pattern NS13 in an inclined manner toward the top surface 150_US of the first source/drain pattern. The third-second stacking fault 232 may extend from the top surface 150_US of the first source/drain pattern in an inclined manner toward the bottom surface 150R_BS of the first source/drain recess. In other words, the third-first stacking fault 231 may have a positive slope with respect to the top surface 150_US of the first source/drain pattern, while the third-second stacking fault 232 may have a negative slope with respect to the top surface 150_US of the first source/drain pattern. The third-first stacking fault 231 and the third-second stacking fault 232 may extend from the top surface 150_US of the first source/drain pattern in an inclined manner toward both opposing sidewalls in the first direction D1 of the first-third sheet pattern NS13, respectively. In some embodiments, the third-first stacking fault 231 and the third-second stacking fault 232 may not meet each other, e.g., may be on opposite sides of the first source/drain contact 180.

Figure 9:
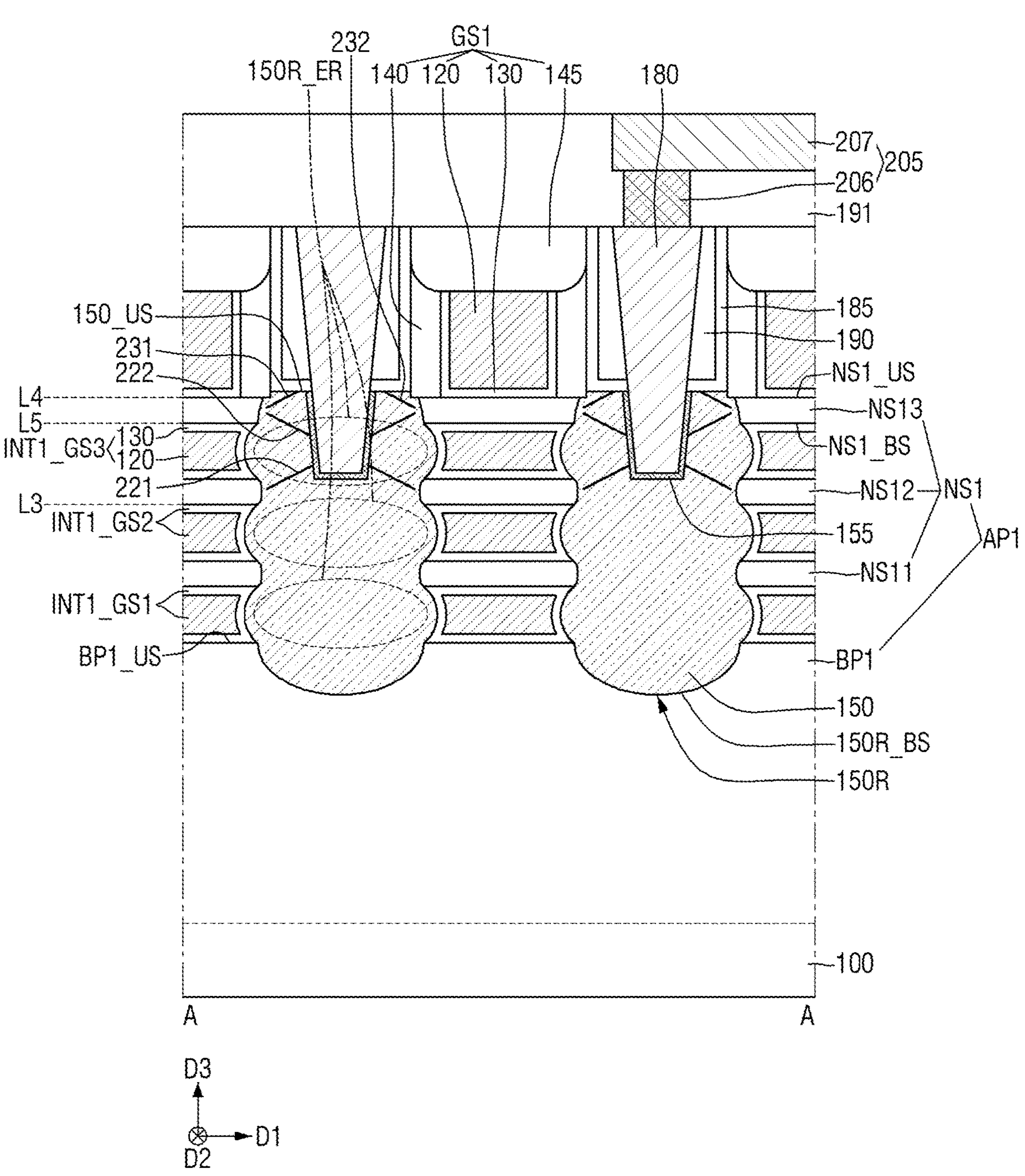

Referring to FIG. 9, in the semiconductor device according to some embodiments, the first source/drain pattern 150 may include the second stacking fault 221 and 222 as described above with reference to FIG. 7, and the third stacking fault 231 and 232 as described above with reference to FIG. 8.

Figure 10:
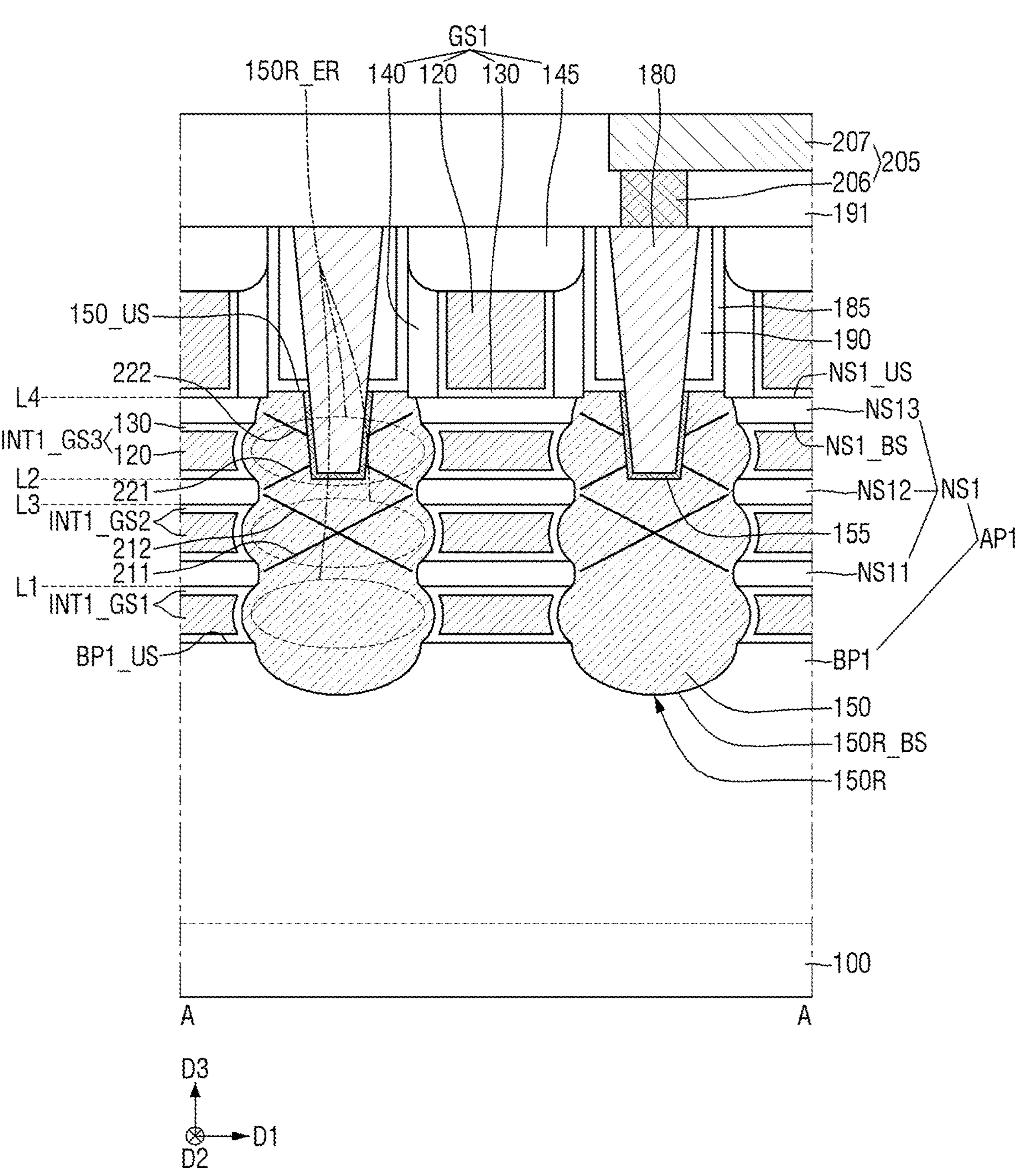

Referring to FIG. 10, in the semiconductor device according to some embodiments, the first source/drain pattern 150 may include the first stacking fault 211 and 212 as described above with reference to FIG. 2, and the second stacking fault 221 and 222 as described above with reference to FIG. 7.

Figure 11:
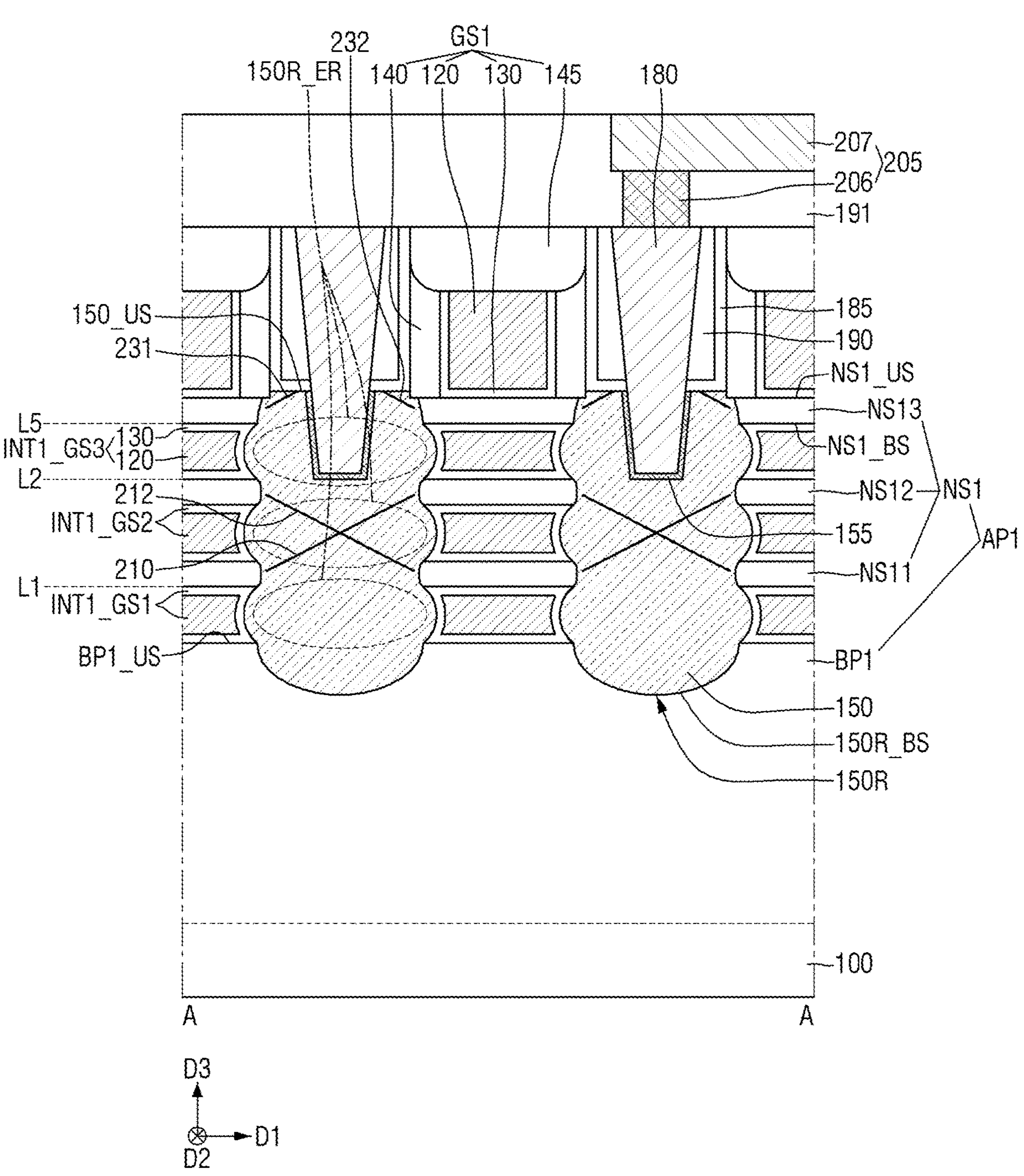

Referring to FIG. 11, in the semiconductor device according to some embodiments, the first source/drain pattern 150 may include the first stacking fault 211 and 212 as described above with reference to FIG. 2, and the third stacking fault 231 and 232 as described above with reference to FIG. 8.

Figure 12:
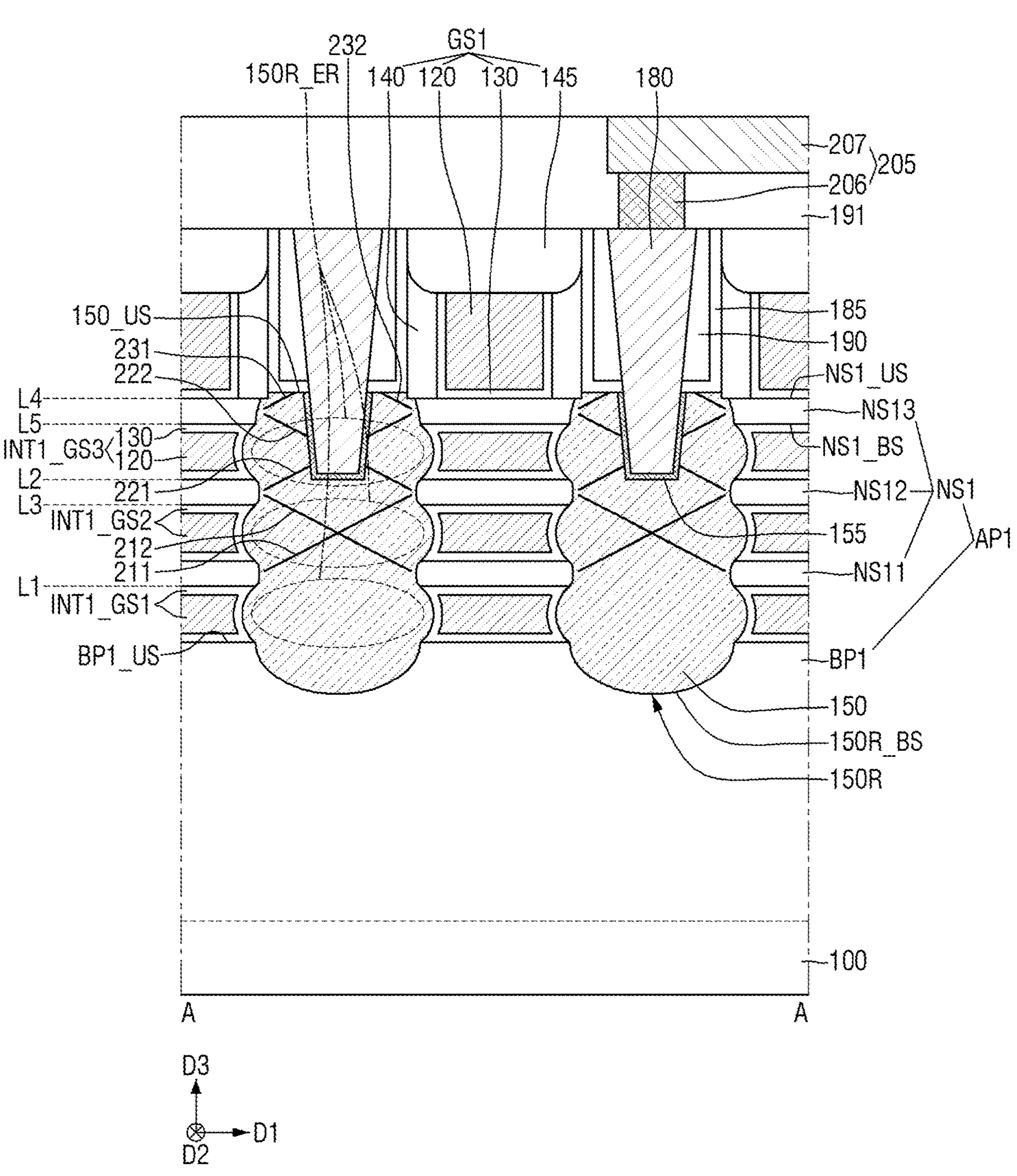

Referring to FIG. 12, in the semiconductor device according to some embodiments, the first source/drain pattern 150 may include the first stacking fault 211 and 212 as described above with reference to FIG. 2, the second stacking fault 221 and 222 as described above with reference to FIG. 7, and the third stacking fault 231 and 232 as described above with reference to FIG. 8.

Figure 13:
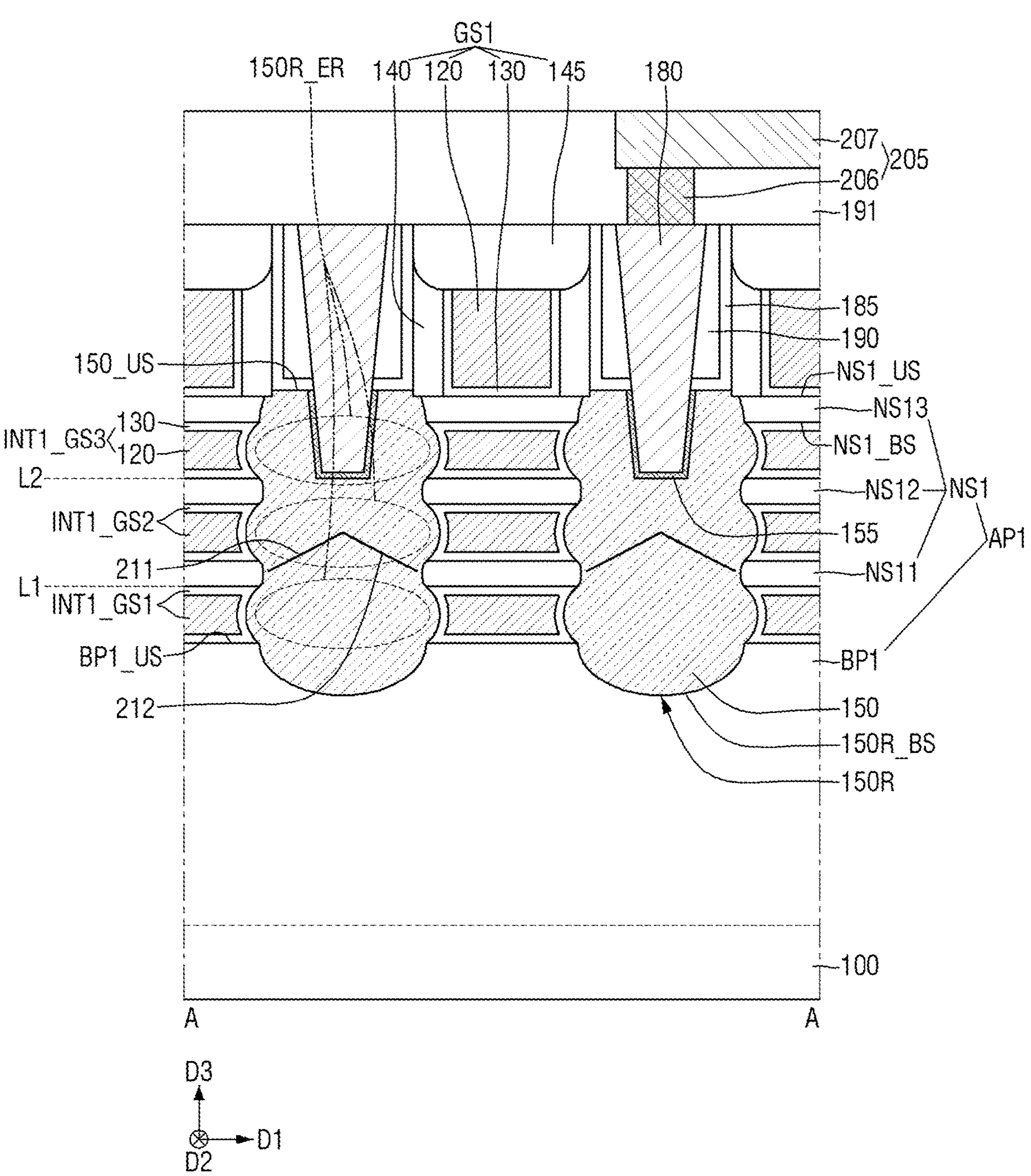

Referring to FIG. 13, in the semiconductor device according to some embodiments, the first-first stacking fault 211 and the first-second stacking fault 212 may meet each other but may not intersect each other. The first-first stacking fault 211 and the first-second stacking fault 212 may meet each other at a point within the first source/drain pattern 150. For example, the first-first stacking fault 211 and the first-second stacking fault 112 may meet each other to form a "V" shape.

The first-first stacking fault 211 and the first-second stacking fault 212 may be terminated at the point at which the first-first stacking fault 211 and the first-second stacking fault 212 meet each other.

Figure 14:
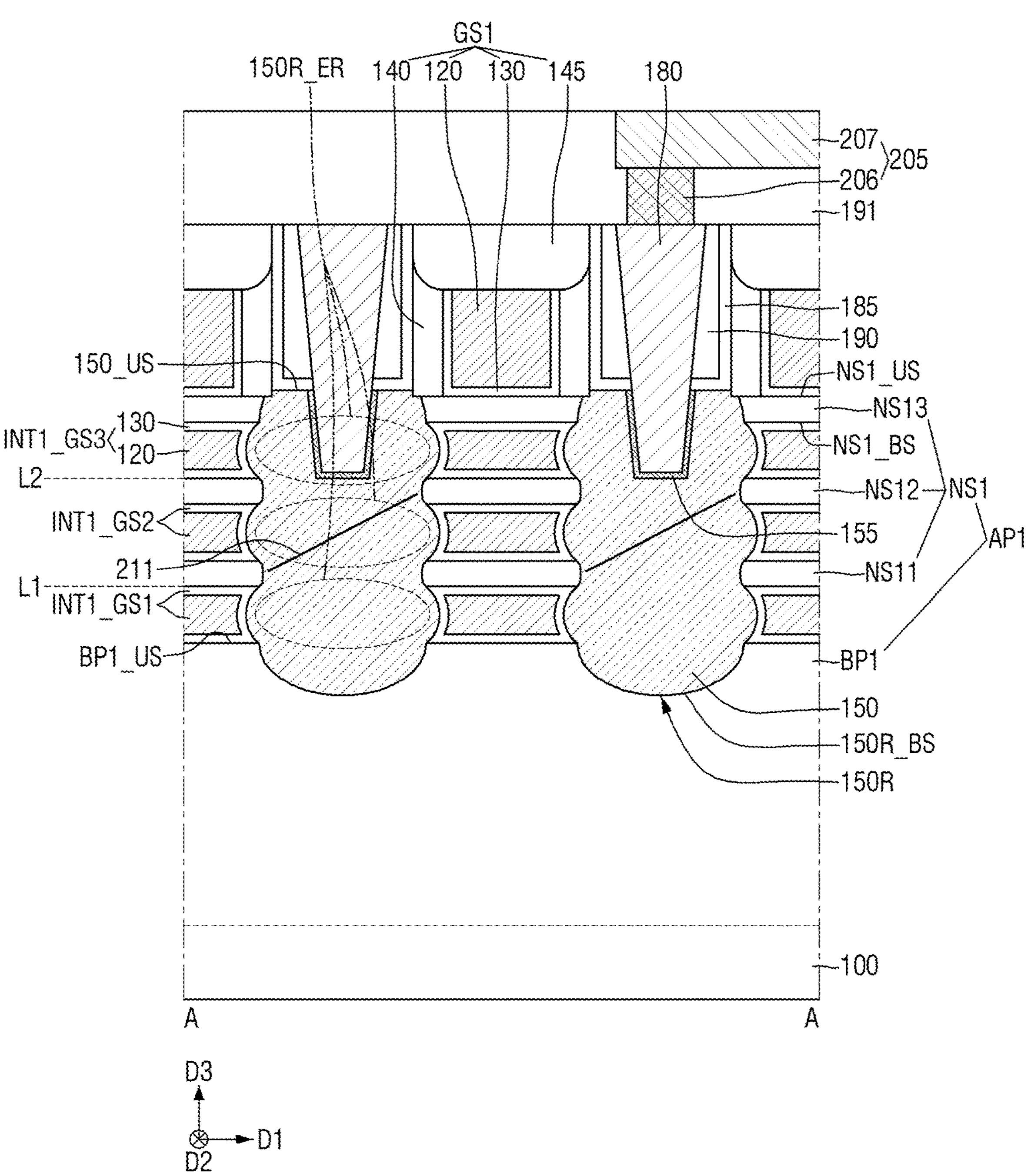

Referring to FIG. 14, in the semiconductor device according to some embodiments, the first source/drain pattern 150 may include the first stacking fault 211 having a positive slope or a negative slope with respect to the top surface BP1_US of the first lower pattern. For example, the first stacking fault 211 may have a positive slope with respect to the top surface BP1_US of the first lower pattern. However, the present disclosure is not limited thereto, and the first source/drain pattern 150 may include a stacking fault having a negative slope with respect to the top surface BP1_US of the first lower pattern.

Figure 15:
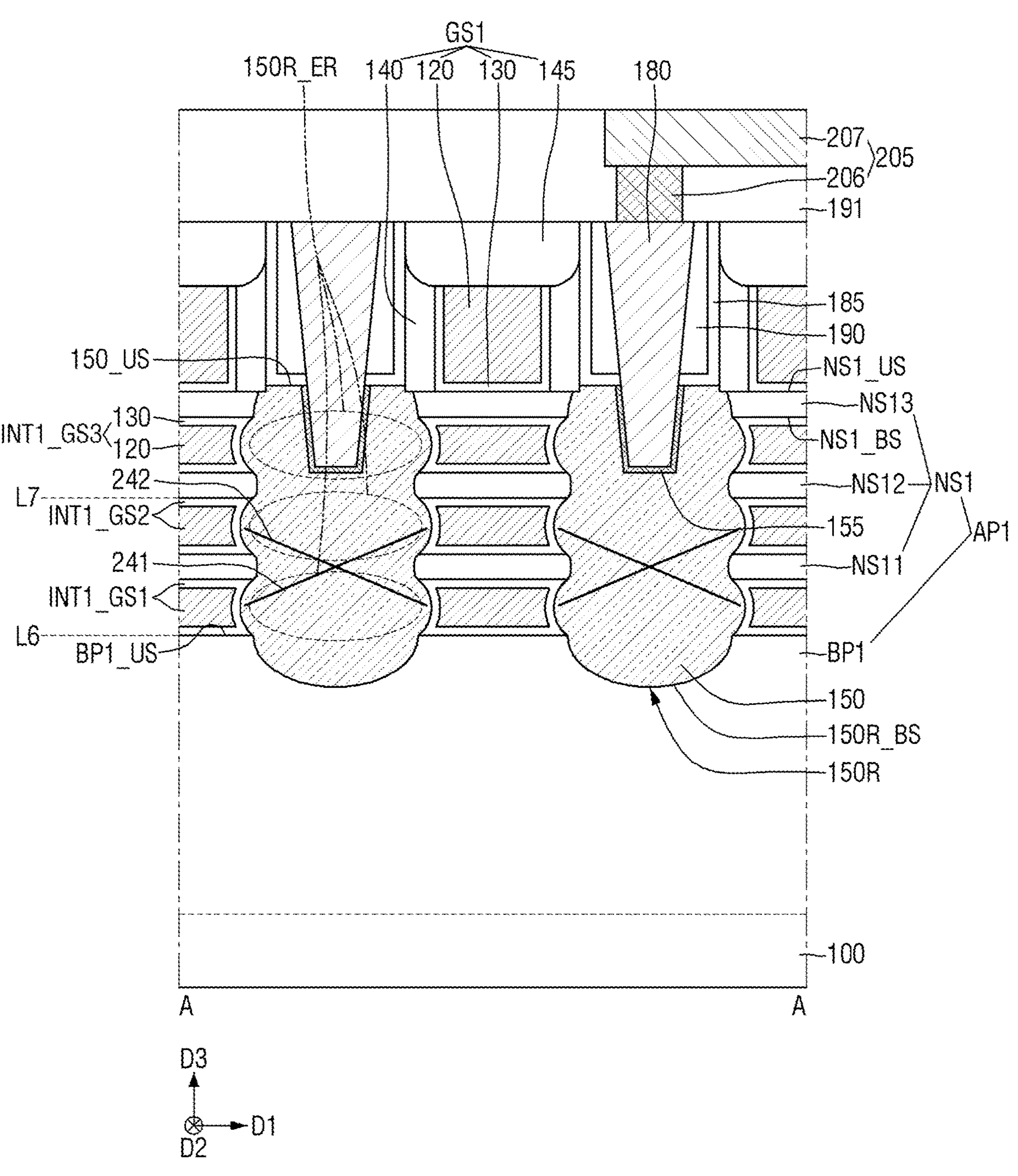

Referring to FIG. 15, in the semiconductor device according to some embodiments, the first source/drain pattern 150 may include a fourth stacking fault 241 and 242. The fourth stacking fault 241 and 242 may extend from a point spaced away from a sidewall of the inner gate structures INT1_GS1, INT1_GS2, and INT1_GS3 or from the sidewall of the inner gate structures INT1_GS1, INT1_GS2, and INT1_GS3. The fourth stacking fault 241 and 242 may start to extend from the sidewall of the inner gate structures INT1_GS1, INT1_GS2, and INT1_GS3 or the point adjacent to the sidewall of the inner gate structures INT1_GS1, INT1_GS2, and INT1_GS3.

In some embodiments, the fourth stacking fault 241 and 242 may be disposed between an extension line L6 of a bottom surface of the first inner gate structure INT1_GS1 and an extension line L7 of a top surface of the second inner gate structure INT1_GS2. The extension line L6 of the bottom surface of the first inner gate structure INT1_GS1 may be an extension line of the top surface BP1_US of the first lower pattern, while the extension line L7 of the top surface of the second inner gate structure INT1_GS2 may be an extension line of the bottom surface of the first-second sheet pattern NS12.

In some embodiments, the fourth stacking fault 241 and 242 may include a fourth-first stacking fault 241 having a positive slope relative to the top surface BP1_US of the first lower pattern and a fourth-second stacking fault 242 having a negative slope relative to the top surface BP1_US of the first lower pattern. For example, the fourth-first stacking fault 241 may extend from a point spaced from the sidewall of the first inner gate structure INT1_GS1 or from the sidewall of the first inner gate structure INT1_GS1 in an inclined manner toward the top surface 150_US of the first source/drain pattern. The fourth-second stacking fault 242 may extend from a point spaced apart from the sidewall of the second inner gate structure INT1_GS2 or from the sidewall of the second inner gate structure INT1_GS2 in an inclined manner toward the bottom surface 150R_BS of the first source/drain recess.

Figure 16:
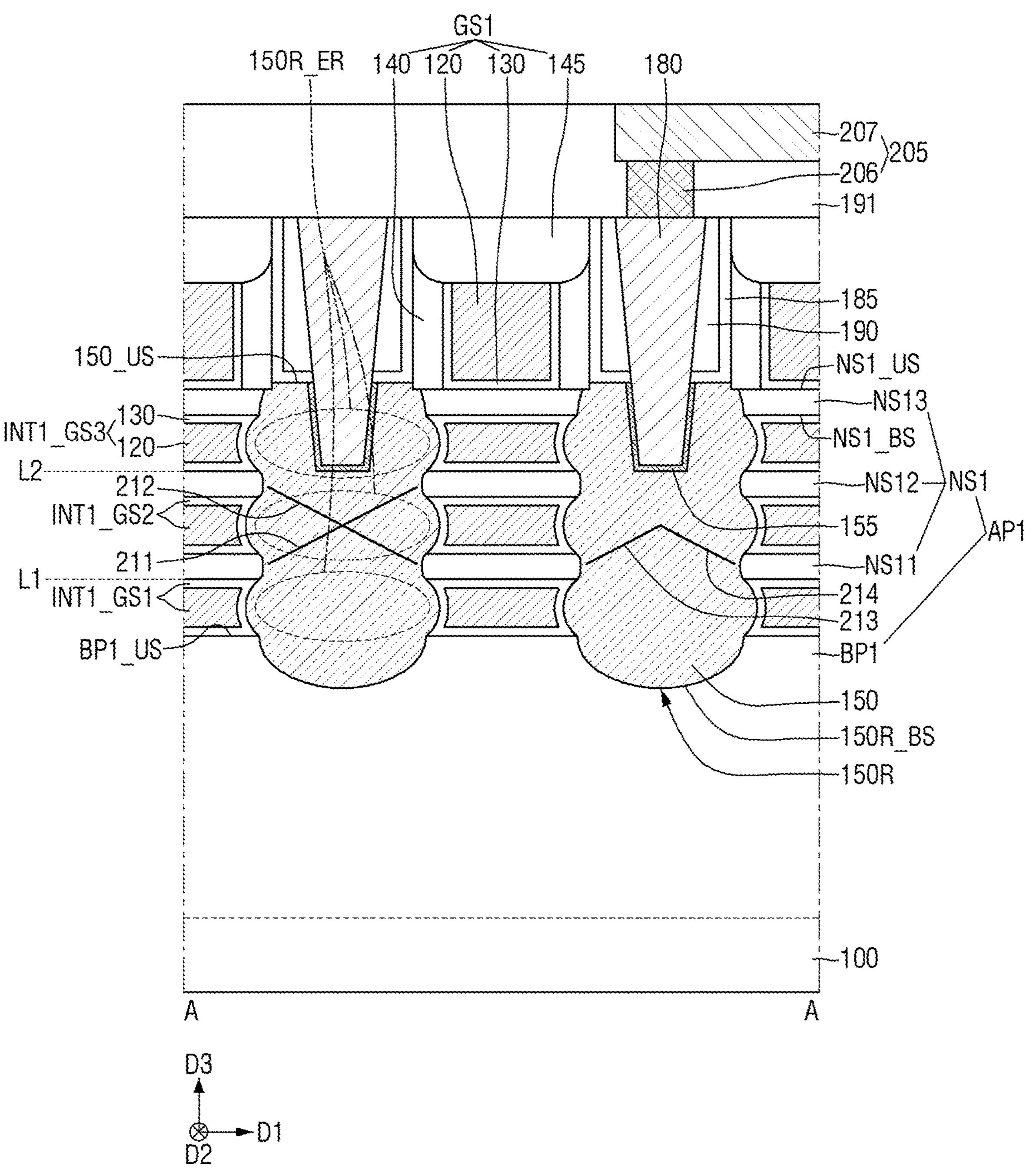

Referring to FIG. 16, in the semiconductor device according to some embodiments, the first source/drain pattern 150 disposed on one side of the first gate structure GS1 and the first source/drain pattern 150 disposed on the other side of the first gate structure GS1 150 may include stacking faults 211, 212, 213, and 214 of different shapes.

For example, the first source/drain pattern 150 disposed on one side of the first gate structure GS1 may include the first-first stacking fault 211 and the first-second stacking fault 212 intersecting each other to form an "X" shape. The first source/drain pattern 150 disposed on the other side of the first gate structure GS1 may include a first-third stacking fault 213 and a first-fourth stacking fault 214 meeting each other to form a "V" shape.

In some embodiments, the first source/drain pattern 150 disposed on one side of the first gate structure GS1 and the first source/drain pattern 150 disposed on the other side of the first gate structure GS1 may be disposed between the extension line L1 of the bottom surface of the first-first sheet pattern NS11 and the extension line L2 of the top surface of the first-second sheet pattern NS12. However, the present disclosure is not limited thereto, and the first source/drain pattern 150 disposed on one side of the first gate structure GS1 and the first source/drain pattern 150 disposed on the other side of the first gate structure GS1 may be disposed in different areas. For example, the first source/drain pattern 150 disposed on one side of the first gate structure GS1 and the first source/drain pattern 150 disposed on the other side of the first gate structure GS1 may be respectively disposed in two different areas among following different areas: an area between the extension line L1 of the bottom surface of the first-first sheet pattern NS11 and the extension line L2 of the top surface of the first-second sheet pattern NS12, an area between the extension line L3 of the bottom surface of the first-second sheet pattern NS12 and the extension line L4 of the top surface of the first-third sheet pattern NS13, and an area between the extension line L5 of the bottom surface of the first-third sheet pattern NS13 and the top surface 150_US of the first source/drain pattern.

Figure 17:
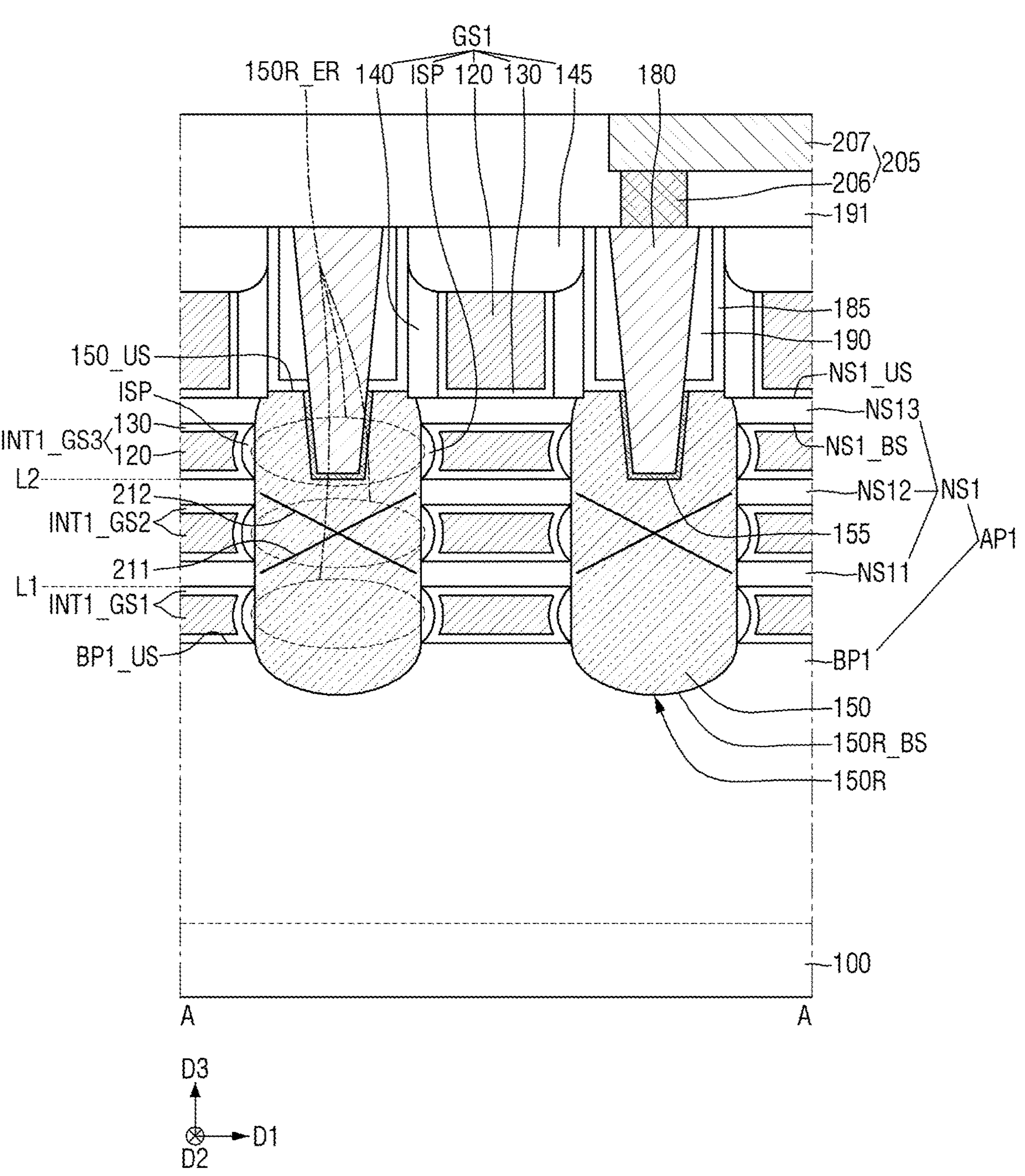

Referring to FIG. 17, in the semiconductor device according to some embodiments, the first gate structure GS1 may further include an inner spacer ISP. The inner spacer ISP may be disposed between adjacent ones of the first sheet patterns NS1 adjacent to each other in the third direction D3 and between the first lower pattern BP1 and the first-first sheet pattern NS11. The inner spacer ISP may contact the first gate insulating film 130 included in the inner gate structures INT1_GS1, INT1_GS2, and INT1_GS3. The inner spacer ISP may define a portion of the first source/drain recess 150R.

Figure 18:
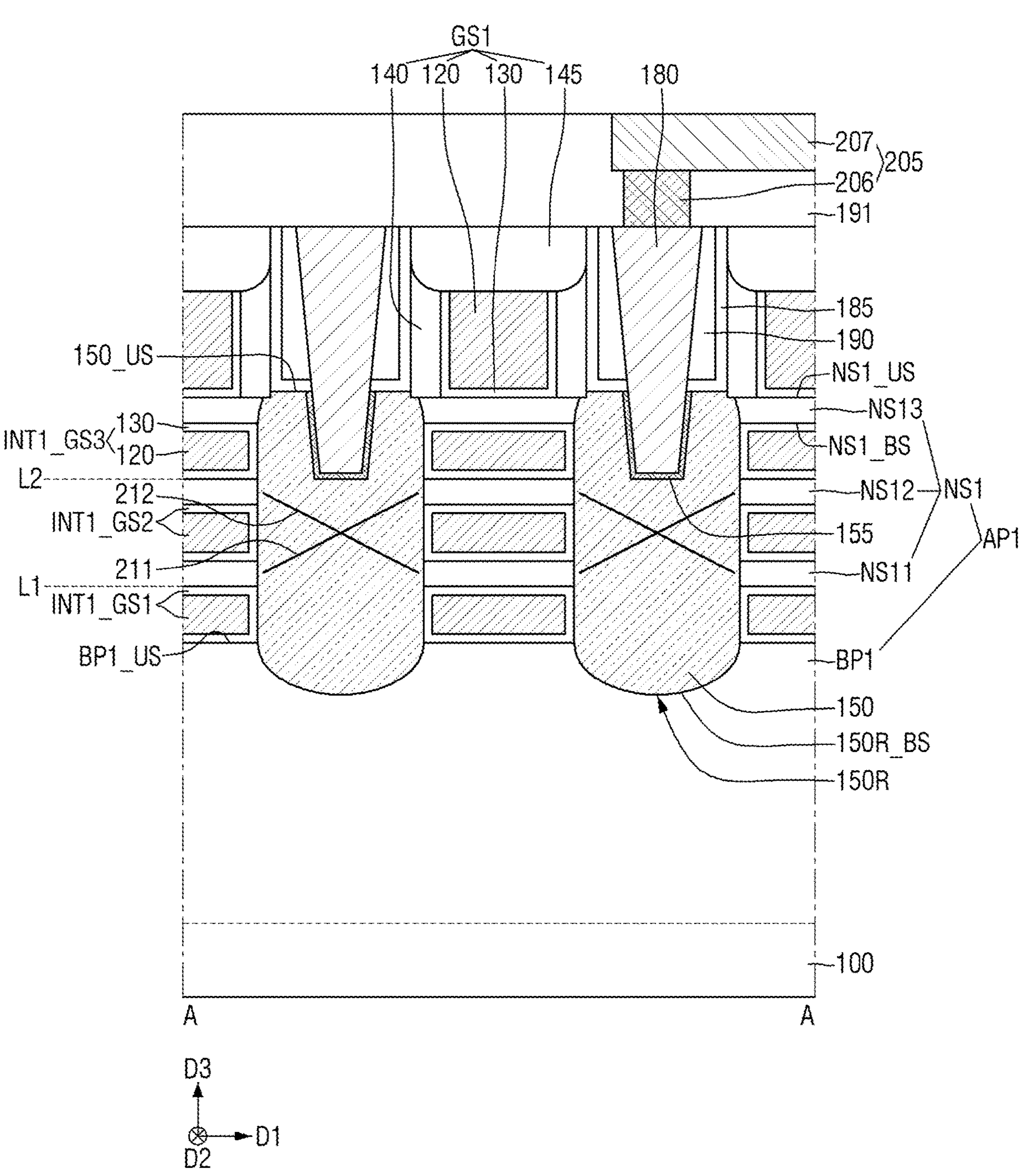

Referring to FIG. 18, in the semiconductor device according to some embodiments, the first source/drain recess 150R does not include a plurality of width extension areas (150R_ER of FIG. 2). A sidewall of the first source/drain recess 150R does not have a wavy shape. The first source/drain recess 150R may include a portion, wherein as the portion extends away from the top surface BP1_US of the first lower pattern, the dimension in the first direction D1 of the portion is constant. An upper portion of the sidewall of the first source/drain recess 150R may decrease in a dimension in the first direction D1 as the upper portion extends away from the first lower pattern BP1.

Figure 19:
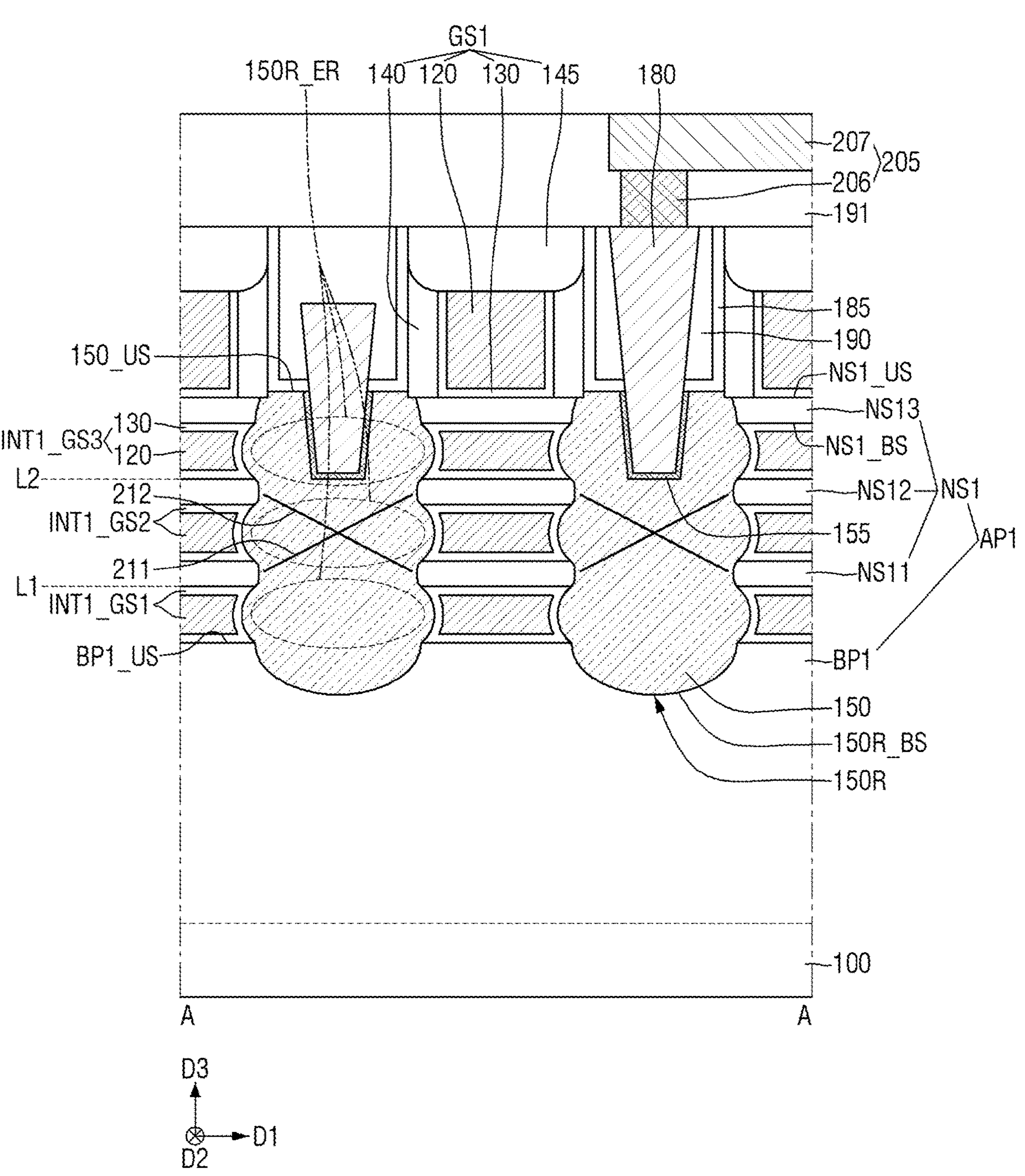

Referring to FIG. 19, in the semiconductor device according to some embodiments, a vertical level of a top surface of a portion of the first source/drain contact 180 not connected to the wiring structure 205 is lower than that of a top surface of the first gate capping pattern 145, e.g., relative to a bottom of the substrate 100. A vertical level of a top surface of a portion of the first source/drain contact 180 connected to the wiring structure 205 is higher than that of the top surface of the portion of the first source/drain contact 180 not connected to the wiring structure 205, e.g., relative to a bottom of the substrate 100.

Figure 20:
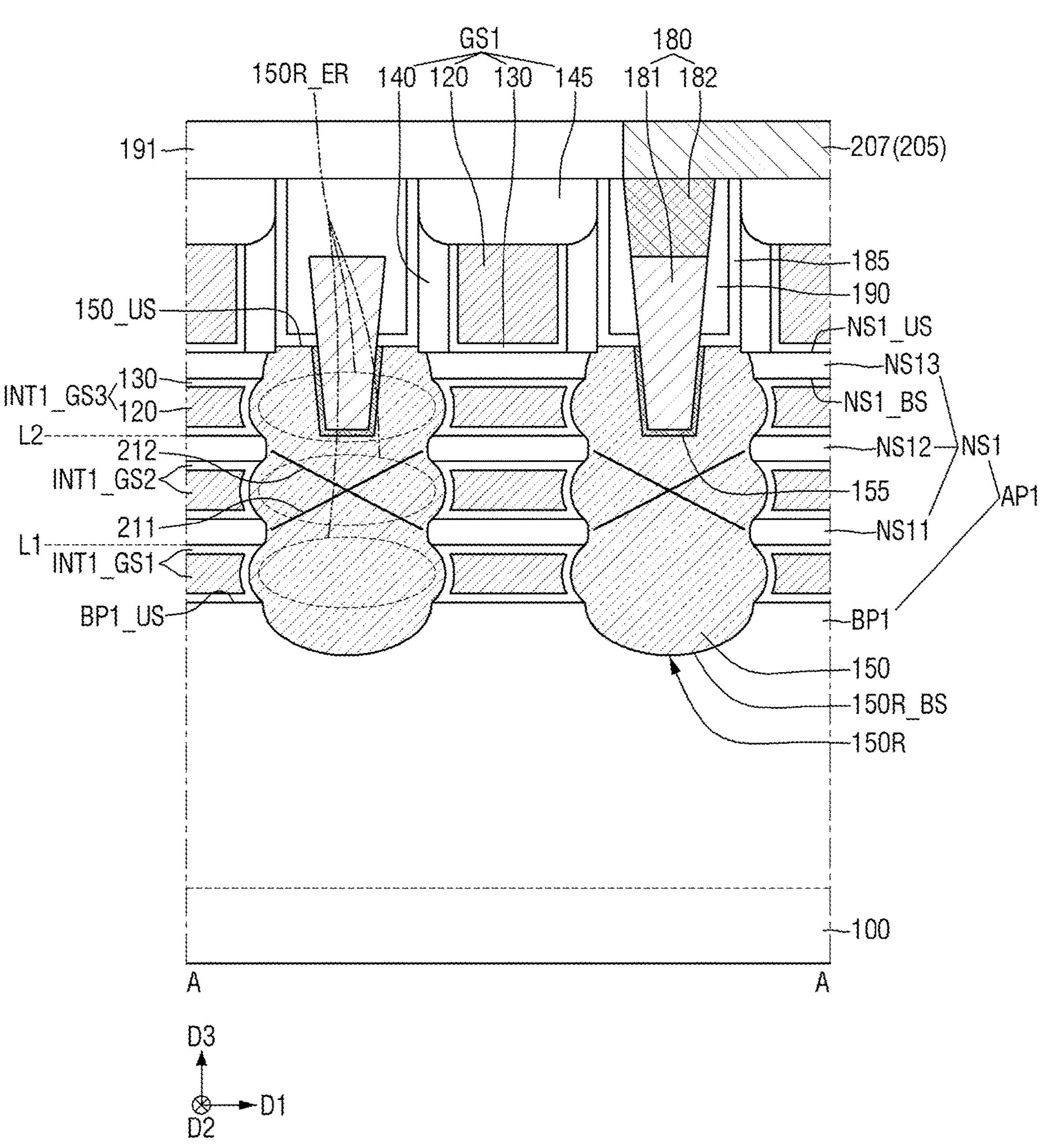

Referring to FIG. 20, in the semiconductor device according to some embodiments, the first source/drain contact 180 includes a lower source/drain contact 181 and an upper source/drain contact 182. The upper source/drain contact 182 may constitute a portion connected to the wiring structure 205, and the lower source/drain contact 181 may constitute a portion not connected to the wiring structure 205.

In detail, the wiring line 207 may be connected to the first source/drain contact 180 without the wiring via (206 in FIG. 2). The wiring structure 205 may not include the wiring via (206 in FIG. 2).

Although it is illustrated that each of the lower source/drain contact 181 and the upper source/drain contact 182 is embodied as a single film, this is only for convenience of illustration, e.g., each of the lower source/drain contact 181 and the upper source/drain contact 182 may be embodied as multiple films. Each of the lower source/drain contact 181 and the upper source/drain contact 182 may include, e.g., at least one of metal, metal alloy, conductive metal nitride, conductive metal carbide, conductive metal oxide, conductive metal carbonitride, and a two-dimensional material (2D material).

Figure 21:
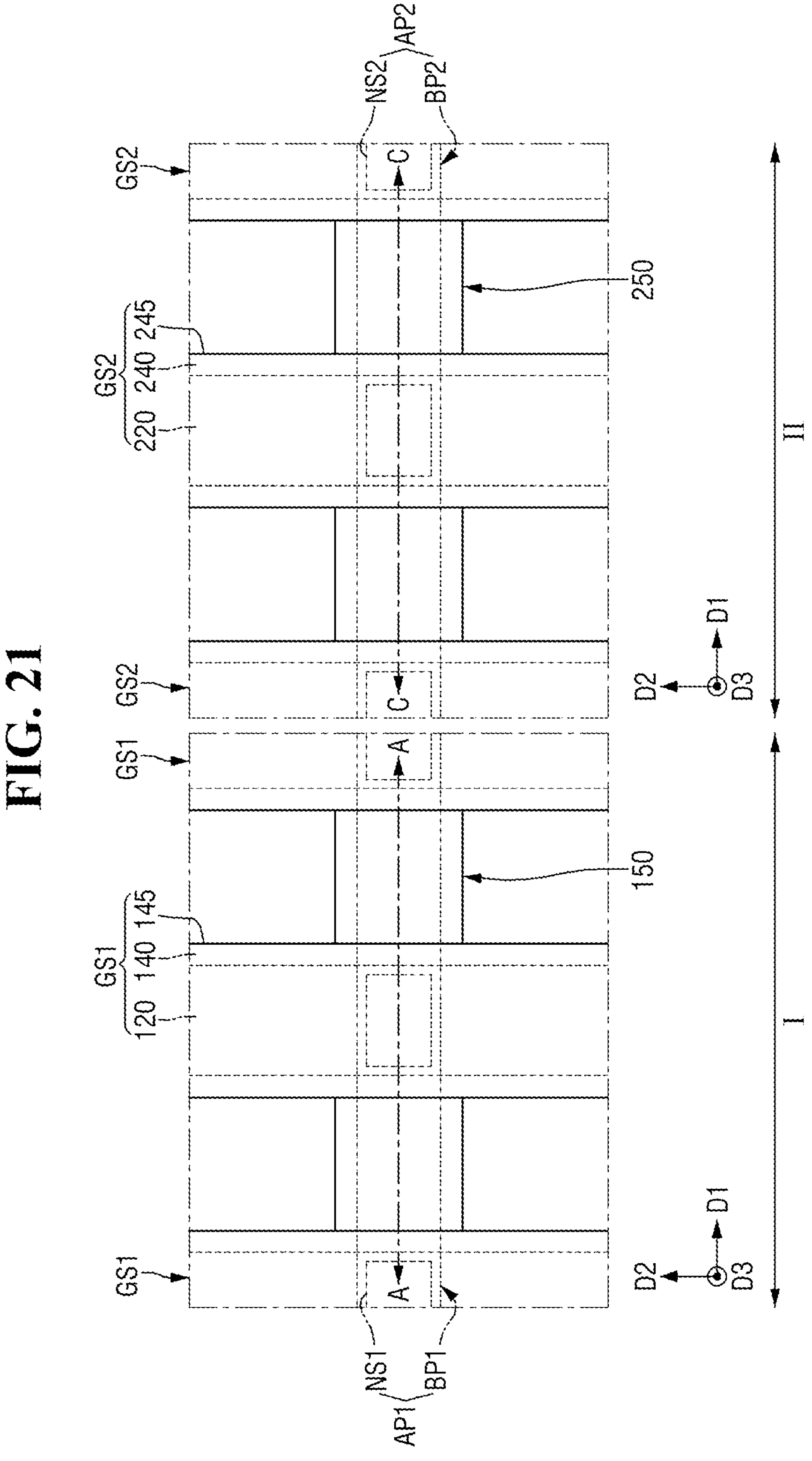
FIG. 21 and FIG. 22 are diagrams of a semiconductor device according to some embodiments.
Figure 22:
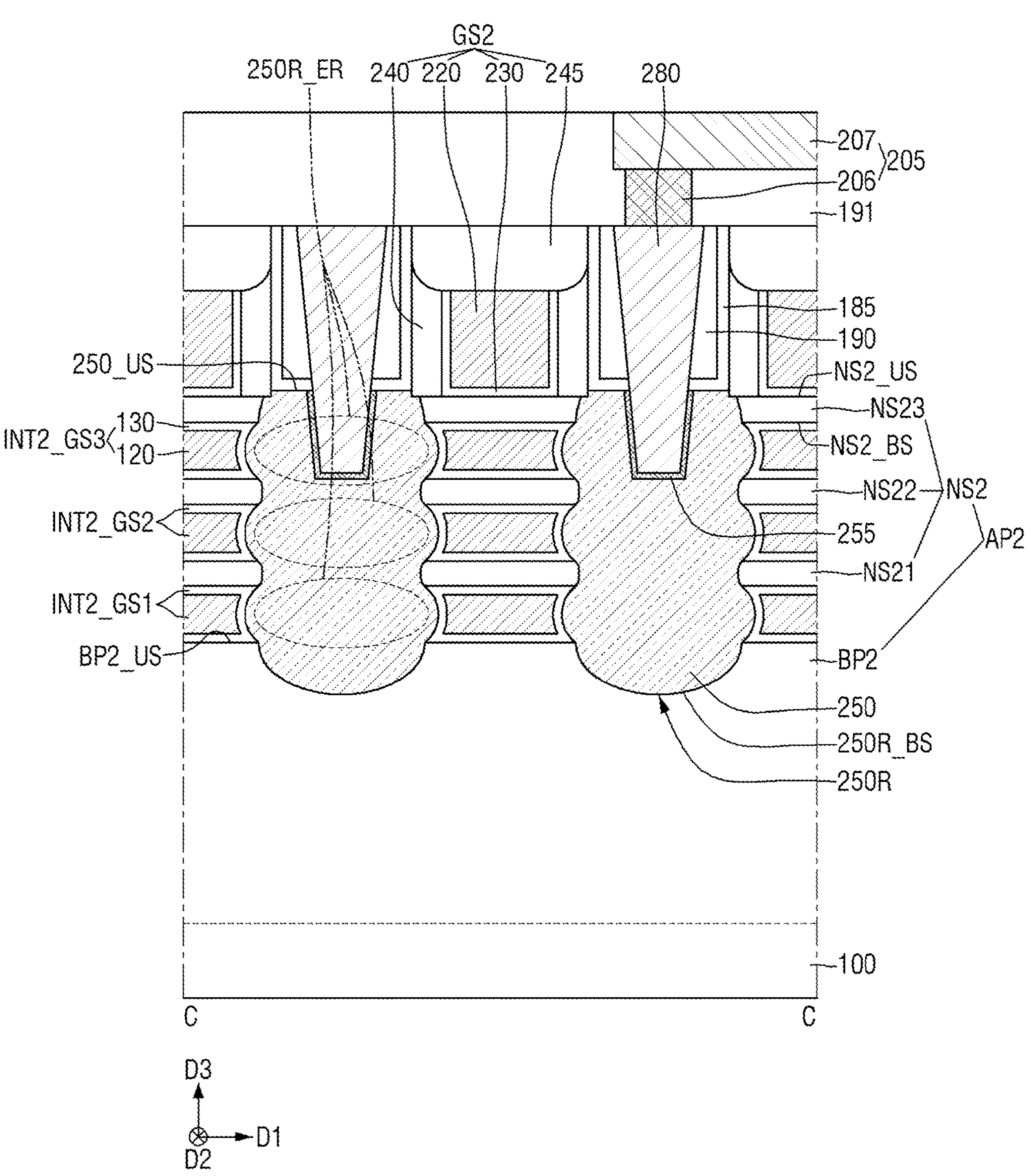

FIG. 21 and FIG. 22 are diagrams for illustrating a semiconductor device according to some embodiments. For reference, FIG. 21 is a plan view of a semiconductor device according to some embodiments, and FIG. 22 is a cross-sectional view along line C-C of FIG. 21.

Further, the cross-sectional view along line A-A in FIG. 21 may be the same as one of FIG. 2 to FIG. 20. In addition, descriptions of a first area I in FIG. 21 may be substantially the same as those related to the NMOS among the descriptions as set forth above with reference to FIG. 1 to FIG. 20. Therefore, the following descriptions are directed to a second area II in FIG. 21.

Referring to FIG. 21 and FIG. 22, a semiconductor device according to some embodiments may include the first active pattern AP1, the plurality of first gate structures GS1, the first source/drain pattern 150, a second active pattern AP2, a plurality of second gate structures GS2, and a second source/drain pattern 250 on the substrate 100.

The substrate 100 may include the first area I and the second area II. The first area I may be an area in which an NMOS is formed, and the second area II may be an area in which a PMOS is formed.

The first active pattern AP1, the plurality of first gate structures GS1, and the first source/drain pattern 150 are disposed in the first area I of the substrate 100. The second active pattern AP2, the plurality of second gate structures GS2, and the second source/drain pattern 250 are disposed in the second area II of the substrate 100.

The second active pattern AP2 may include a second lower pattern BP2 and a plurality of second sheet patterns NS2. The plurality of second sheet patterns NS2 is disposed on a top surface BP2_US of the second lower pattern. The plurality of second sheet patterns NS2 may include, e.g., second-first to second-third sheet patterns NS21, NS22, NS23 that are sequentially staked and are spaced apart from each other in the third direction D3 while being disposed on the second lower pattern BP2. Although it is illustrated that the second sheet patterns NS2 include three sheet patterns NS21, NS22, and NS23, this is only for convenience of illustration, and the second sheet patterns NS2 may include any suitable number of sheet patterns.

Each of the second sheet patterns NS2 includes a top surface NS2 US and a bottom surface NS2_BS opposite to each other in the third direction D3. Each of the second lower pattern BP2 and the second sheet pattern NS2 may include, e.g., one of silicon or germanium as an elemental semiconductor material, a group IV-IV compound semiconductor, or a group III-V compound semiconductor. In the semiconductor device according to some embodiments, the second lower pattern BP2 may be a silicon lower pattern including silicon, while the second sheet pattern NS2 may be a silicon sheet pattern including silicon.

The plurality of second gate structures GS2 may be disposed on the substrate 100. The second gate structures GS2 may be disposed on the second active pattern AP2. The second gate structures GS2 may intersect the second active pattern AP2. The second gate structures GS2 may intersect the second lower pattern BP2. The second gate structures GS2 may surround each of the second sheet patterns NS2. The second gate structures GS2 may include a plurality of inner gate structures INT2_GS1, INT2_GS2, and INT2_GS3 disposed between adjacent ones of the second sheet patterns NS2 adjacent to each other in the third direction D3 and between the second lower pattern BP2 and the second-first sheet pattern NS21. The second gate structures GS2 may include, e.g., a second gate electrode 220, a second gate insulating film 230, a second gate spacer 240 and a second gate capping pattern 245.

The second source/drain pattern 250 may be formed on the second active pattern AP2. The second source/drain pattern 250 may be formed on the second lower pattern BP2. The second source/drain pattern 250 may be connected to the second sheet pattern NS2. The second source/drain pattern 250 may be included in a source/drain of a transistor using the second sheet pattern NS2 as a channel area.

The second source/drain pattern 250 may be disposed in a second source/drain recess 250R. The second source/drain recess 250R may include a plurality of width extension areas 250R_ER. A bottom surface of the second source/drain recess 250R may be defined by the second lower pattern BP2. A sidewall of the second source/drain recess 250R may be defined by the second sheet pattern NS2 and the inner gate structures INT2_GS1, INT2_GS2, and INT2_GS3.

The second source/drain pattern 250 may contact the second gate insulating film 230 and the second lower pattern BP2 of the inner gate structures INT2_GS1, INT2_GS2, and INT2_GS3. The second source/drain pattern 250 may contain doped p-type impurities. The second source/drain pattern 250 does not include the stacking fault (e.g., the second source/drain pattern 250 does not include the first stacking fault 211 and 212 in FIG. 2).

A second source/drain contact 280 is disposed on the second source/drain pattern 250. The second source/drain contact 280 is connected to the second source/drain pattern 250. A second metal silicide film 255 may be further disposed between the second source/drain contact 280 and the second source/drain pattern 250.

FIG. 23 to FIG. 29 are diagrams of stages in a method for manufacturing a semiconductor device according to some embodiments. For reference, FIG. 23 to FIG. 28 are cross-sectional views taken along line A-A of FIG. 1.

Figure 23:
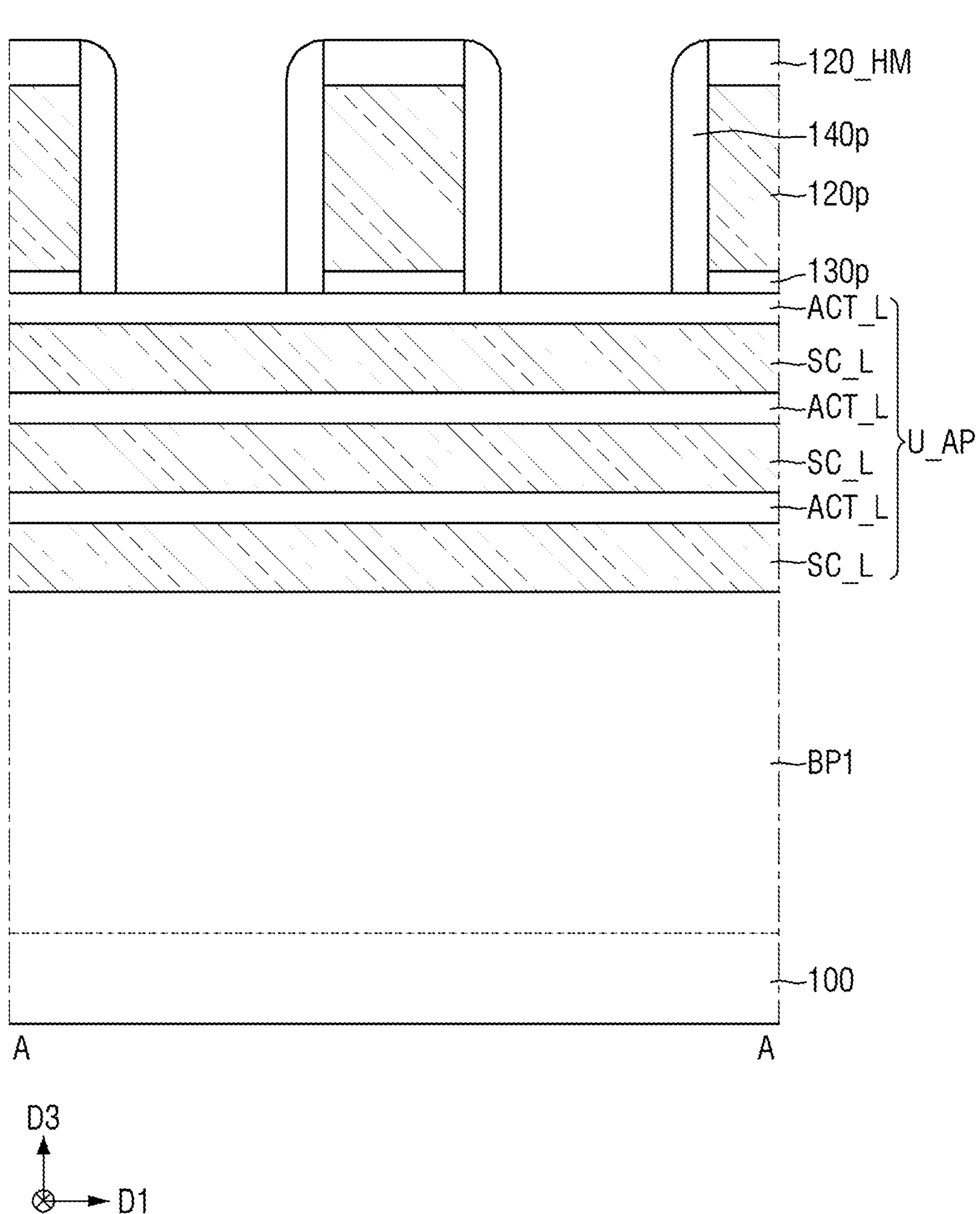

Referring to FIG. 23, the first lower pattern BP1 and an upper pattern structure U_AP may be formed on the substrate 100. The upper pattern structure U_AP may be disposed on the first lower pattern BP1.

The upper pattern structure U_AP may include a plurality of sacrificial patterns SC_L and a plurality of active patterns ACT_L alternately stacked on top of each other while being disposed on the first lower pattern BP1. For example, the sacrificial pattern SC_L may include a silicon-germanium layer, and the active pattern ACT_L may include a silicon film.

Thereafter, a dummy gate insulating film 130*p*, a dummy gate electrode 120*p*, and a dummy gate capping film 120_HM may be formed on the upper pattern structure U_AP. The dummy gate insulating film 130*p* may include, e.g., silicon oxide. The dummy gate electrode 120*p* may include, e.g., polysilicon. The dummy gate capping film 120_HM may include, e.g., silicon nitride. A pre-gate spacer 140*p* may be formed on a sidewall of the dummy gate electrode 120*p*.

Figure 24:
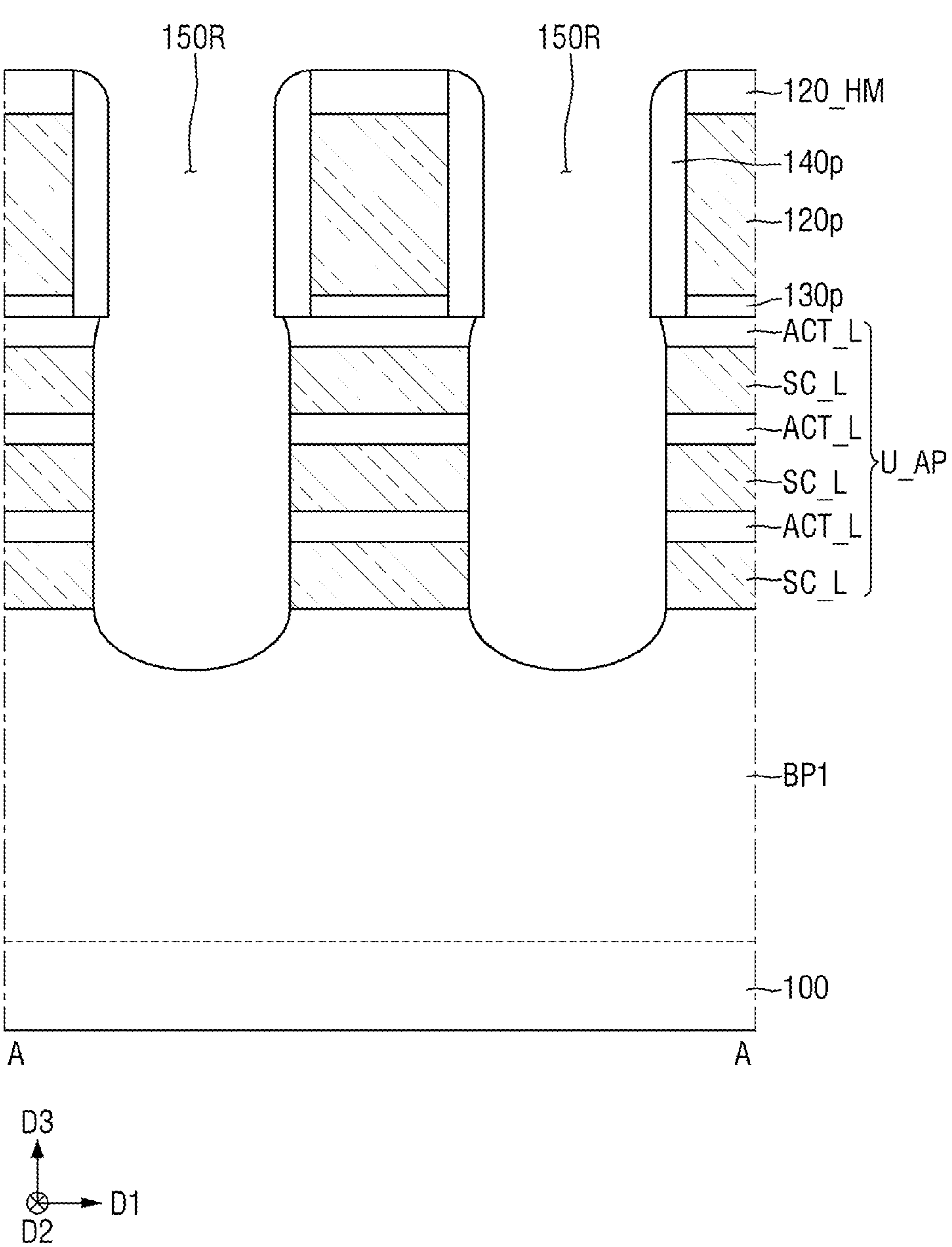
Figure 25:
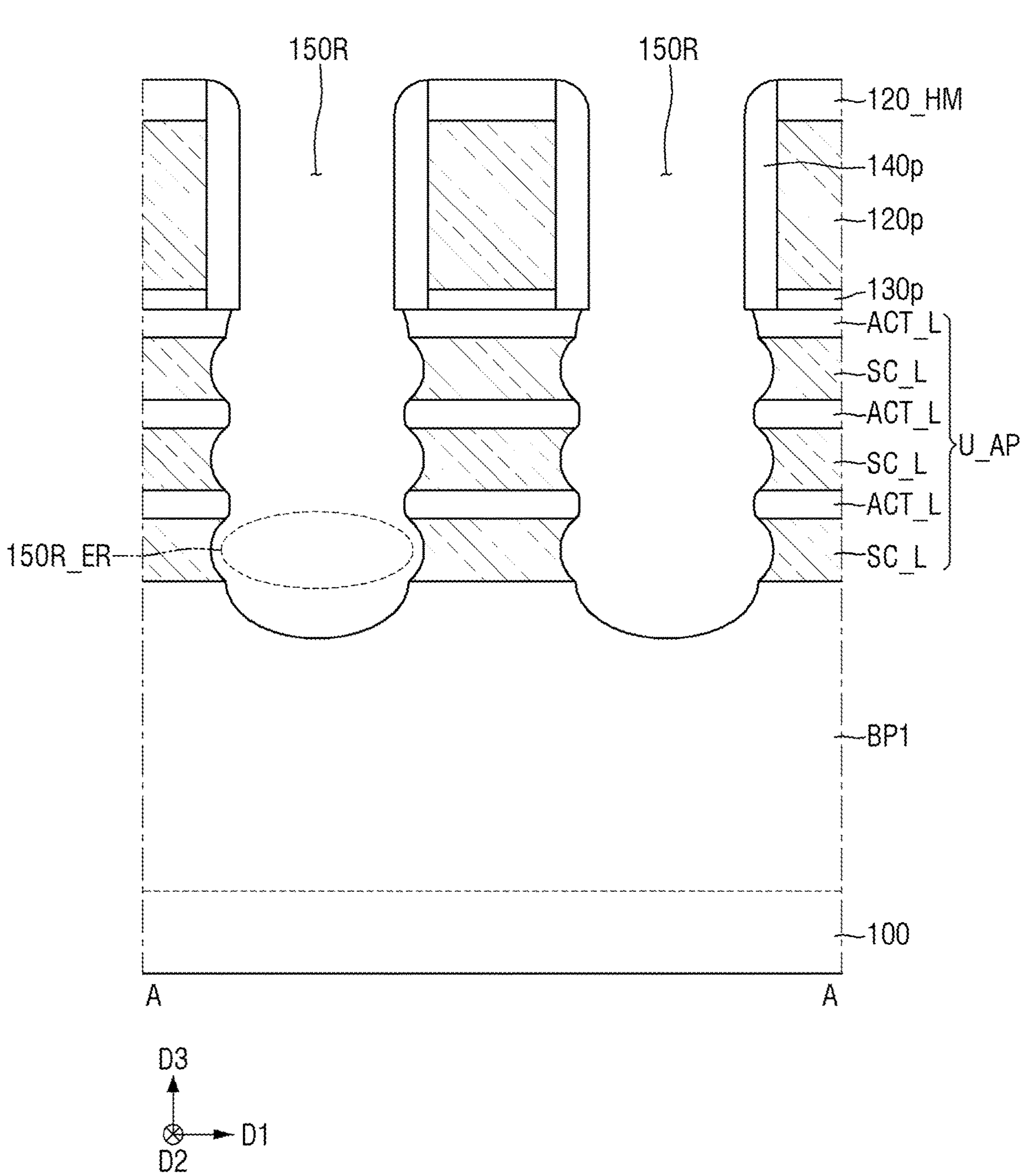

Referring to FIG. 24 and FIG. 25, the first source/drain recess 150R may be formed in the upper pattern structure U_AP using the dummy gate electrode 120*p* as a mask.

A portion of the first source/drain recess 150R may be formed in the first lower pattern BP1. The bottom surface 150R_BS of the first source/drain recess may be defined by the first lower pattern BP1.

In FIG. 24, a dimension in the first direction D1 of the first source/drain recess 150R increases and then decreases as the recess extends away from the first lower pattern BP1. In FIG. 25, the first source/drain recess 150R may include a plurality of width extension areas 150R_ER.

For example, the first source/drain recess 150R, as shown in FIG. 24, may be formed and then the sacrificial pattern SC_L may be additionally etched to form the width extension area 150R_ER of the first source/drain recess. Thus, as illustrated in FIG. 25, the sidewall of the first source/drain recess 150R may have a wavy shape.

Subsequent steps of the manufacturing method are described based on the first source/drain recess 150R as shown in FIG. 25.

Figure 26:
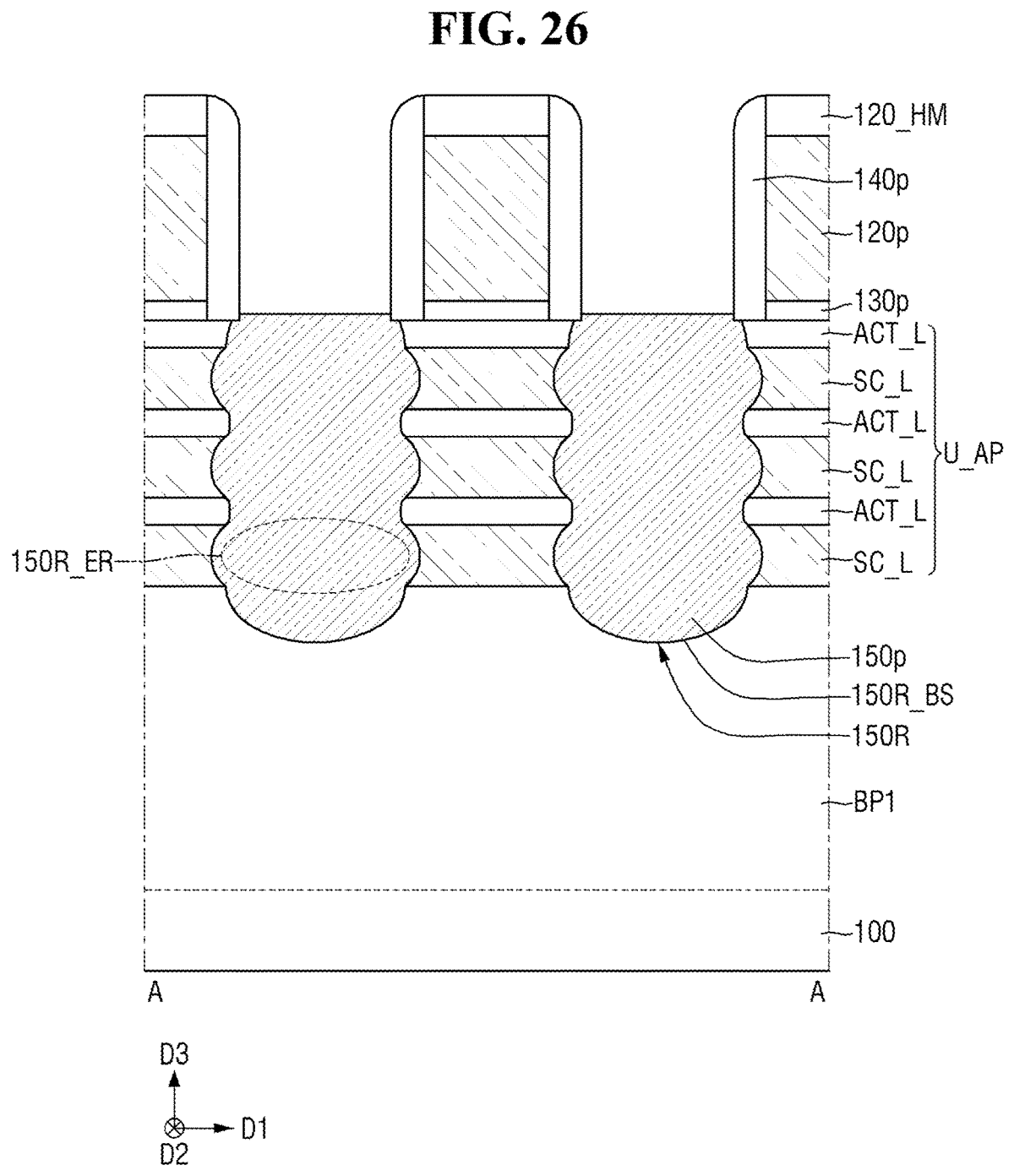

Referring to FIG. 26, a pre-source/drain pattern 150*p* may be formed in the first source/drain recess 150R. The pre-source/drain pattern 150*p* may fill the first source/drain recess 150R. The pre-source/drain pattern 150*p* is formed on the first lower pattern BP1.

Then, referring to FIG. 27 to FIG. 29, the first source/drain pattern 150 including the first stacking fault 211 and 212 may be formed using a stress memorization technique (hereinafter, referred to as a "SMT process").

Figure 27:
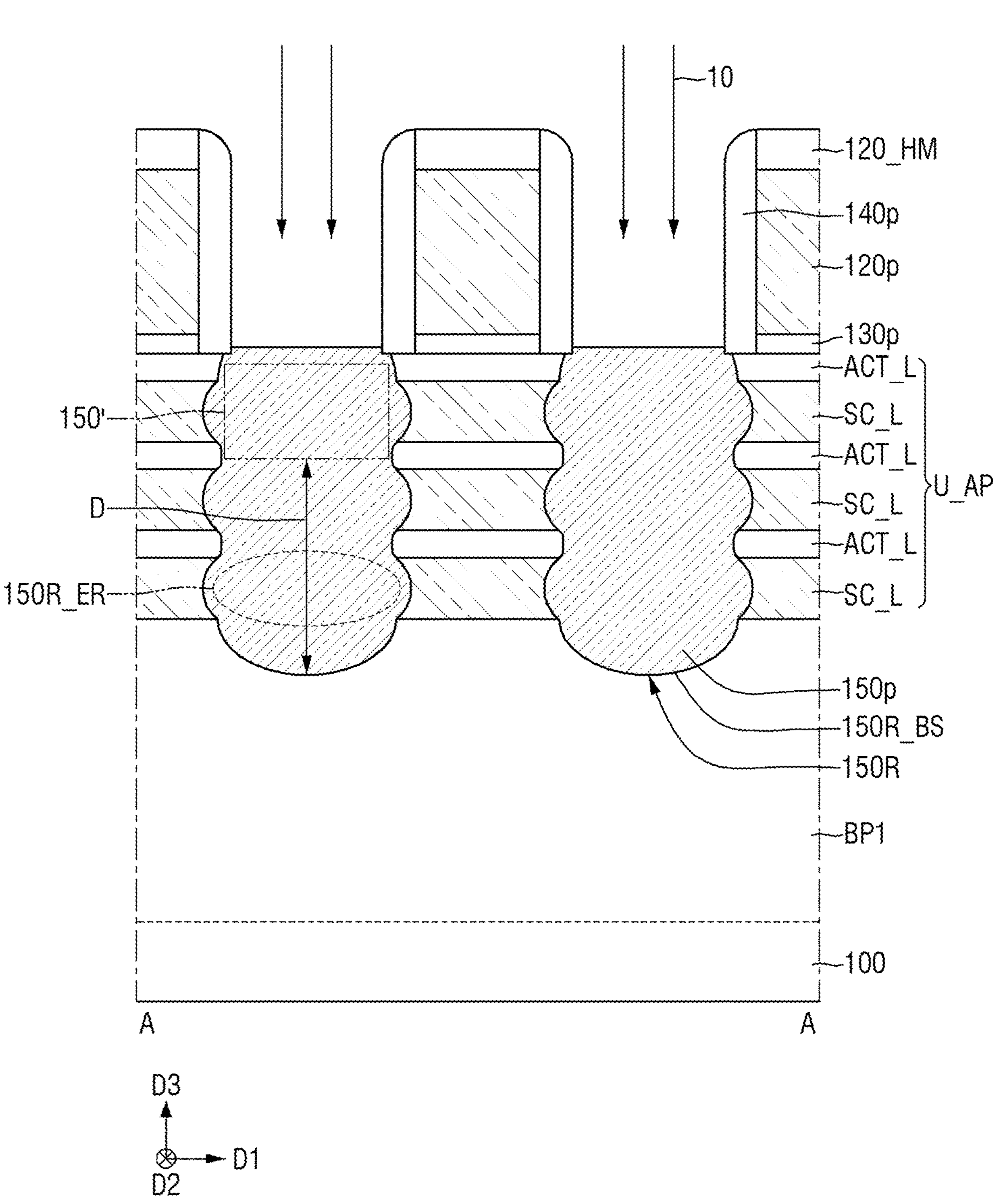

In detail, referring to FIG. 27, at least a portion of the pre-source/drain pattern 150*p* may be amorphized to form an amorphized area 150' in an amorphization process 10. For example, the amorphization process 10 may be performed using the dummy gate electrode 120*p* and the pre-gate spacer 140*p* as a mask.

The amorphized area 150' may be spaced apart from the bottom surface 150R_BS of the first source/drain recess 150R. For example, the amorphized area 150' may not overlap with the first lower pattern BP1 in the first direction D1. A maximum distance D between the bottom surface 150R_BS of the first source/drain recess and the amorphized area 150' may be determined based on the amorphization process 10. For example, when performing the amorphization process 10 with low implant energy, the amorphized area 150' may be close to a top surface of the pre-source/drain pattern 150*p*, e.g., a distance between the top of the amorphized area 150' and the top surface of the pre-source/drain pattern 150*p* may be smaller than distance D. Subsequently, the first stacking fault 211 and 212 may be formed in the amorphized area 150'. That is, the amorphization process 10 may be controlled such that the first stacking fault 211 and 212 may be formed at a desired location within the first source/drain pattern 150.

For example, the amorphization process 10 may be a pre-amorphization ion implantation (PAI) process, e.g., implantation depth, energy, and temperature may be adjusted to determine implantation depth and location of the resultant amorphized area 150'. The amorphization process 10 may include, e.g., implanting at least one of Si, Ge, Xe and C.

Figure 28:
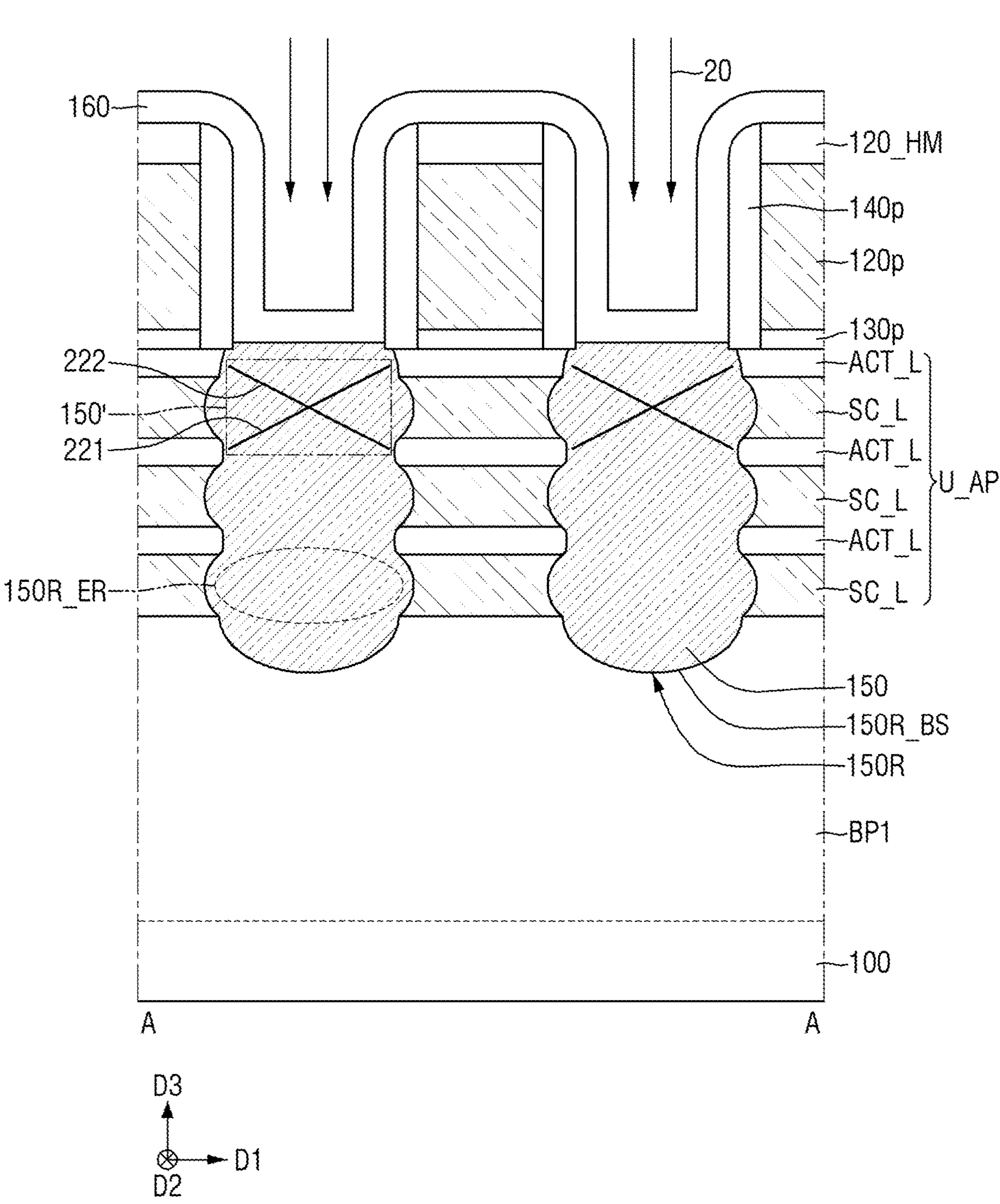

Referring to FIG. 28, a stress film 160 may be formed. The stress film 160 may, e.g., conformally, cover the dummy gate capping film 120_HM, the pre-gate spacer 140*p*, and the amorphized area 150'.

For example, since NMOS may be formed on the first lower pattern BP1, the stress film 160 may include a material capable of applying tensile stress to the plurality of active patterns ACT_L. The stress film 160 may include, e.g., silicon nitride ($Si_xN_y$) or silicon oxide ($SiO_2$).

Thereafter, the amorphized area 150' may be recrystallized via an annealing process 20 to form the first source/drain pattern 150 including the first stacking fault 211 and 212. The annealing process 20 may include, e.g., one of Spike RTA, Flash RTP and Laser annealing. The first stacking fault 211 and 212 may be formed by changing a position of an atomic layer of the amorphized area 150' or adding or eliminating a portion of the atomic layer during the recrystallization of the amorphized area 150'. The process conditions of the amorphization process 10 and the process conditions of the annealing process 20 may be adjusted to control the position and the shape of the first stacking fault 211 and 212.

Figure 29:
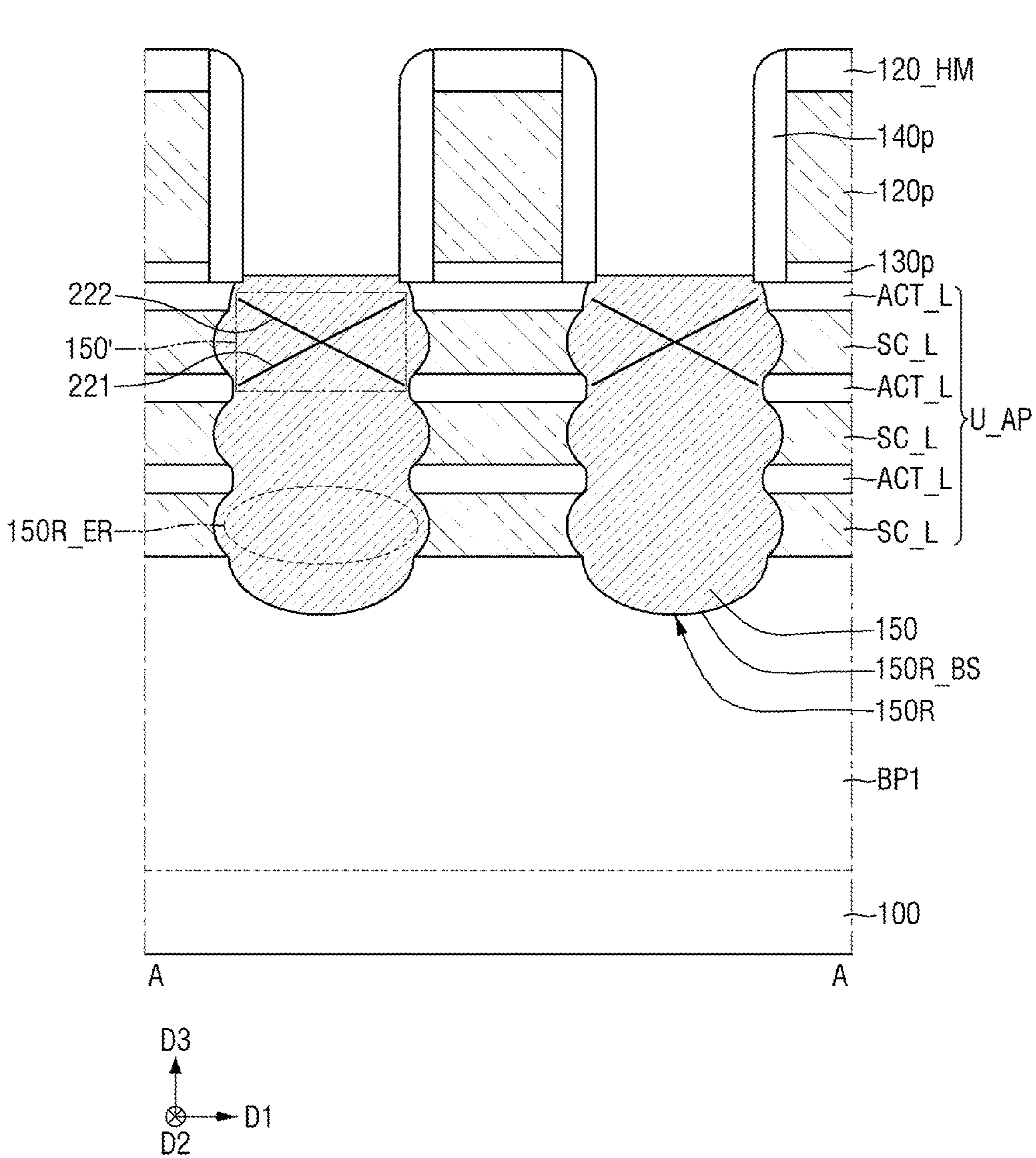

Referring to FIG. 29, the stress film 160 may be removed.

Then, referring to FIG. 2, the source/drain etch stop layer 185 and the first interlayer insulating film 190 may be sequentially formed on the first source/drain pattern 150. Then, a portion of the first interlayer insulating film 190, a portion of the source/drain etch stop layer 185, and the dummy gate capping film 120_HM may be removed to expose a top surface of the dummy gate electrode 120*p*. While the top surface of the dummy gate electrode 120*p* is exposed, the first gate spacer 140 may be formed.

The dummy gate insulating film 130*p* and the dummy gate electrode 120*p* may be removed such that a portion of the upper pattern structure U_AP between the first gate spacers 140 may be exposed. Thereafter, the sacrificial pattern SC_L may be removed such that the first sheet pattern NS1 may be formed. The first sheet pattern NS1 is connected to the first source/drain pattern 150. Thus, the first active pattern AP1 including the first lower pattern BP1 and the first sheet pattern NS1 is may be formed.

Further, the sacrificial pattern SC_L may be removed such that a gate trench may be formed between the first gate spacers 140. When the sacrificial pattern SC_L has been removed, a portion of the first source/drain pattern 150 may be exposed.

The first gate insulating film 130 and the first gate electrode 120 may be formed in the gate trench. Further, the first gate capping pattern 145 may be formed.

Figure 30:
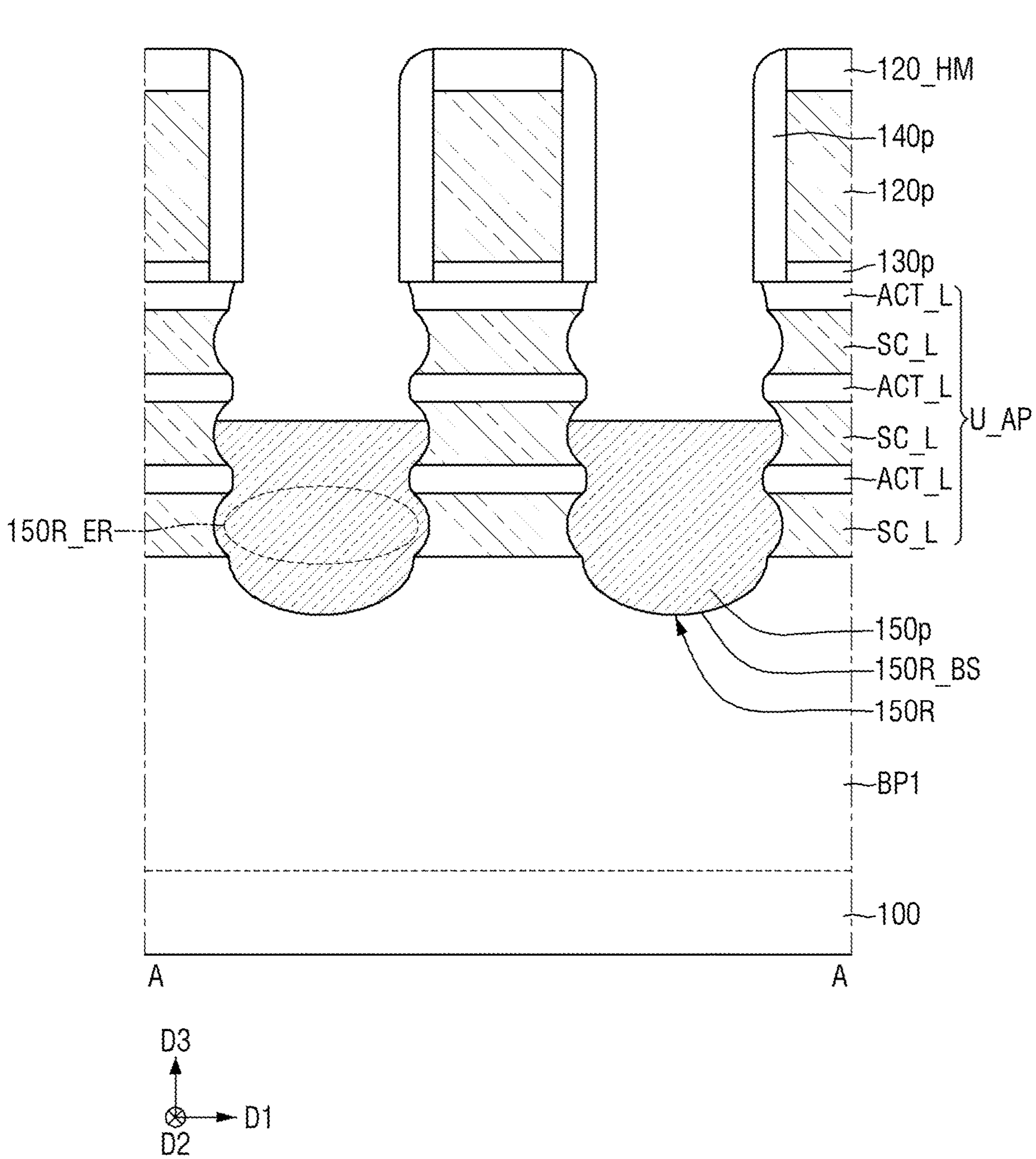
FIG. 30 to FIG. 33 are diagrams of stages in a method for manufacturing a semiconductor device according to some embodiments.

FIG. 30 to FIG. 33 are stages in a method for manufacturing a semiconductor device according to some embodiments. For reference, FIG. 30 to FIG. 33 are cross-sectional views taken along line A-A of FIG. 1. FIG. 30 is a diagram showing a step subsequent to FIG. 25. For convenience of description, the following descriptions are based on differences relative to those described with reference to FIG. 23 to FIG. 29. Referring to FIG. 30, a first pre-source/drain pattern 151*p* may be formed in the first source/drain recess 150R. The first pre-source/drain pattern 151*p* may fill a portion of the first source/drain recess 150R.

Figure 31:
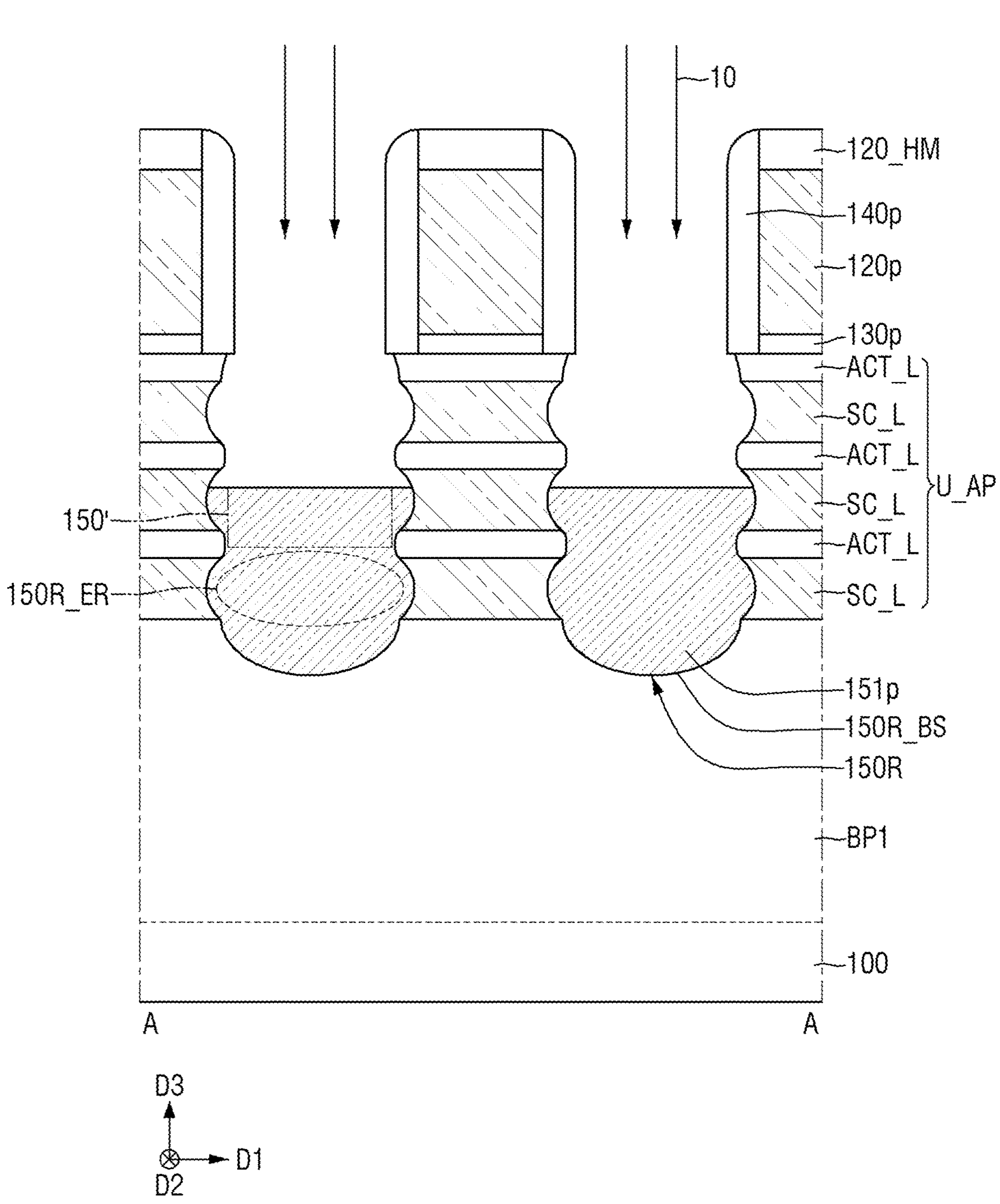

Referring to FIG. 31, in the amorphization process 10, at least a portion of the first pre-source/drain pattern 151*p* may be amorphized to form the amorphized area 150'. For example, the amorphization process 10 may be performed using the dummy gate electrode 120*p* and the pre-gate spacer 140*p* as a mask.

Figure 32:
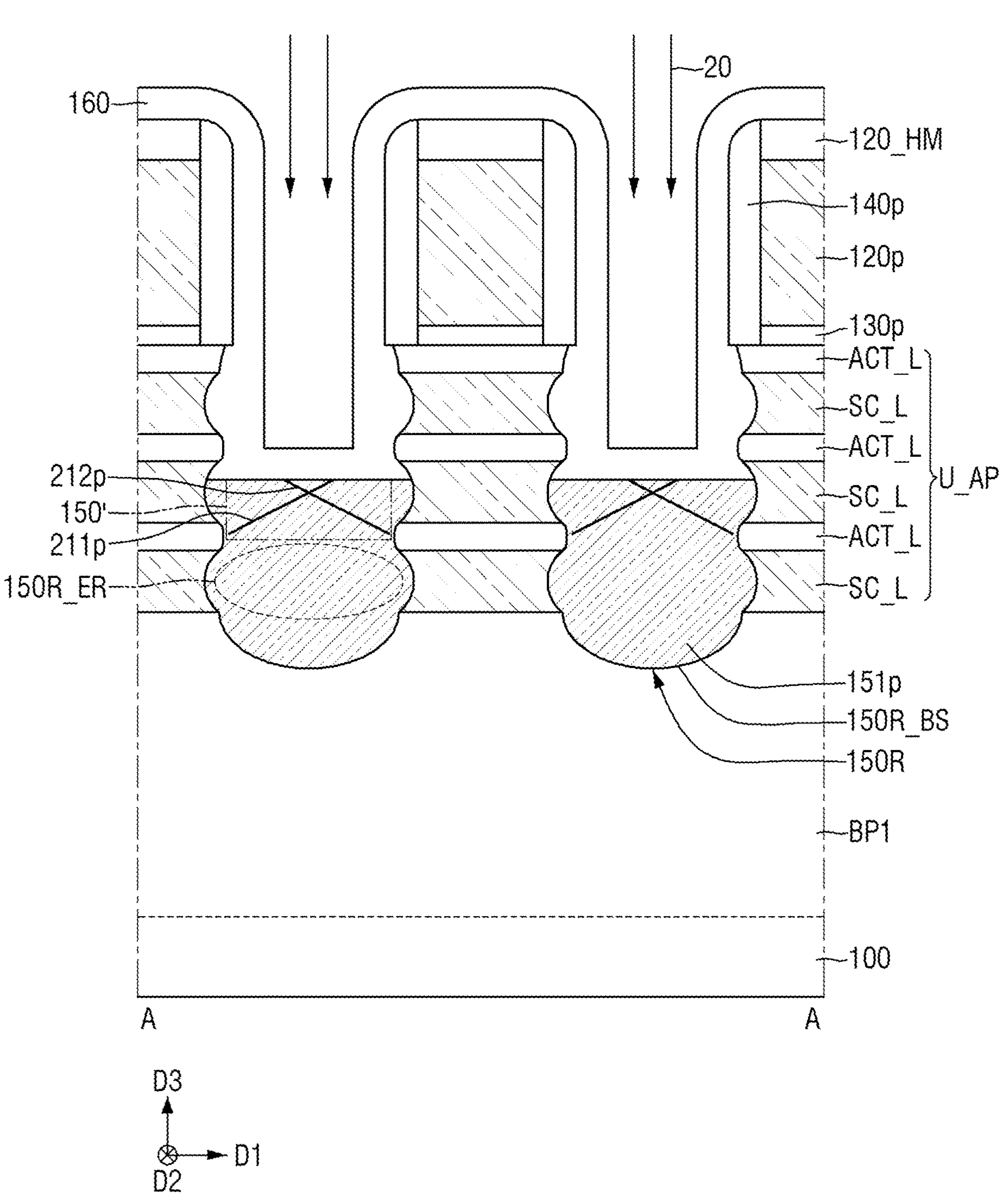

Referring to FIG. 32, the stress film 160 may be formed. Thereafter, the amorphized area 150' may be recrystallized via the annealing process 20 to form a first pre-stacking fault 211*p* and 212*p*. For example, the first pre-stacking fault 211*p* and 212*p* may extend from a sidewall of one active pattern ACT_L or a point spaced from the sidewall of one active pattern ACT_L in an inclined manner toward a top surface of the first pre-source/drain pattern 151*p*.

Figure 33:
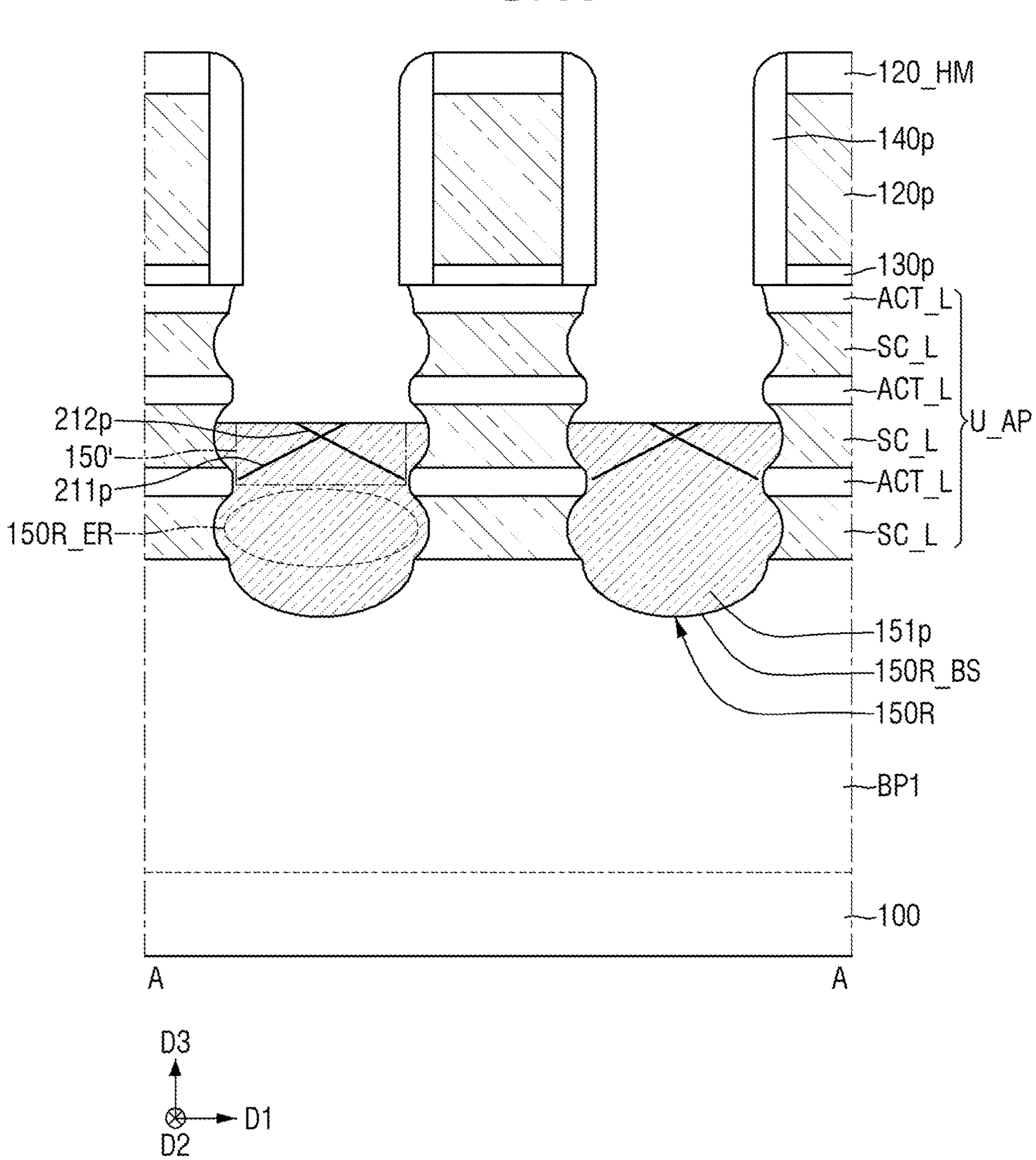

Referring to FIG. 33, the stress film 160 may be removed.

Subsequently, referring to FIG. 2, a second pre-source/drain pattern filling the first source/drain recess 150R may be formed on the pre-source/drain pattern 150*p*. The first pre-stacking fault 211*p* and 212*p* may further extend in the second pre-source/drain pattern and thus may become the first stacking fault 211 and 212. Accordingly, the first source/drain pattern 150 including the first stacking fault 211 and 212 may be formed. That is, the first pre-stacking fault 211*p* and 212*p* may be formed, and then may further extend and thus may become the first stacking fault 211 and 212. In this way, the first stacking fault 211 and 212 may be formed with a smaller amount of energy.

Figure 34:
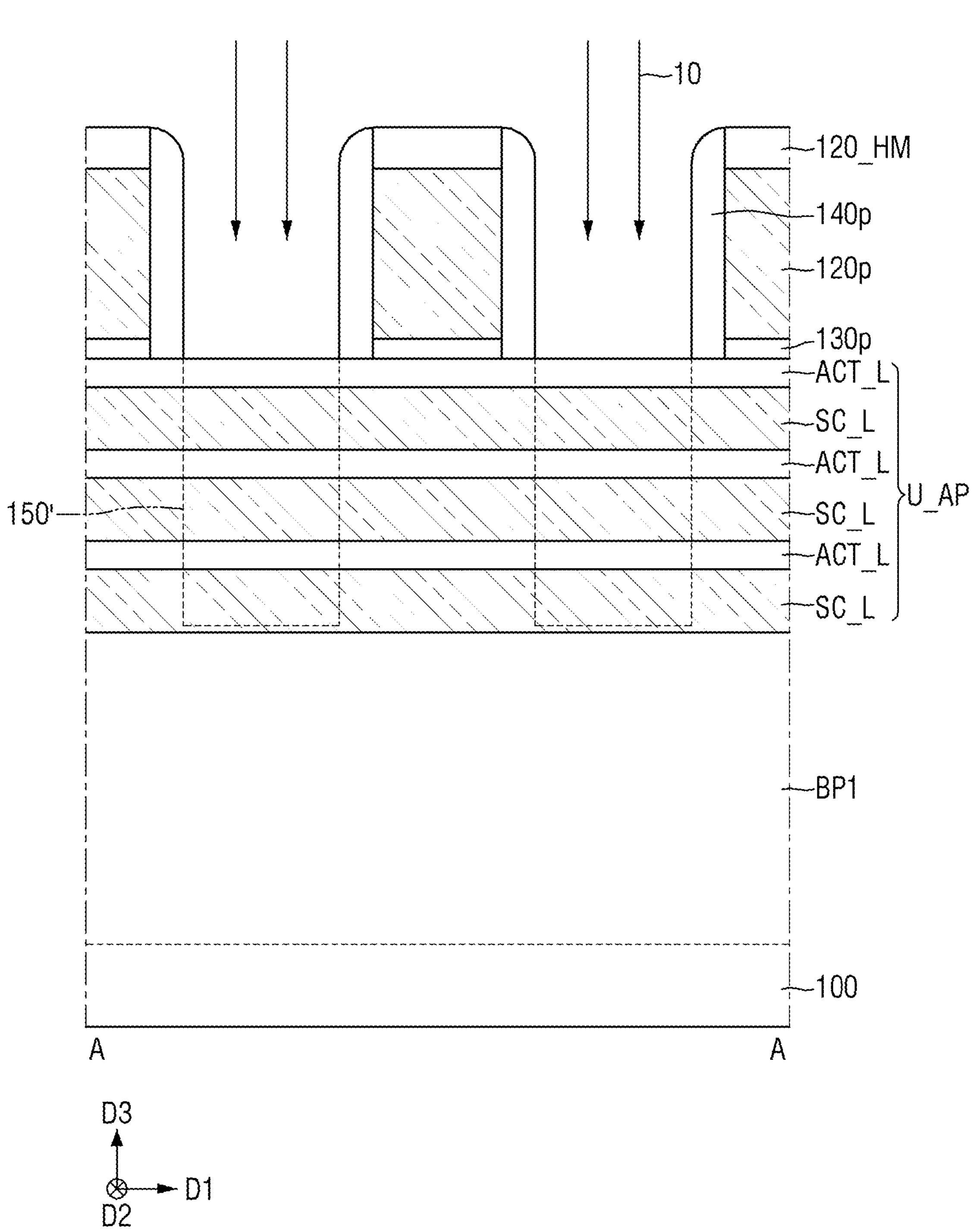
FIG. 34 to FIG. 37 are diagrams of stages in a method for manufacturing a semiconductor device according to some embodiments.

FIG. 34 to FIG. 37 are diagrams of stages in a method for manufacturing a semiconductor device according to some embodiments. For reference, FIG. 34 to FIG. 37 are cross-sectional views along line A-A of FIG. 1. FIG. 34 is a diagram showing a step subsequent to FIG. 23. For convenience of description, the following descriptions are based on differences relative to those described with reference to FIG. 23 to FIG. 29.

Referring to FIG. 34, in the amorphization process 10, at least a portion of the upper pattern structure U_AP may be amorphized to form the amorphized area 150'. For example, the amorphization process 10 may be performed using the dummy gate electrode 120*p* and the pre-gate spacer 140*p* as a mask.

Figure 35:
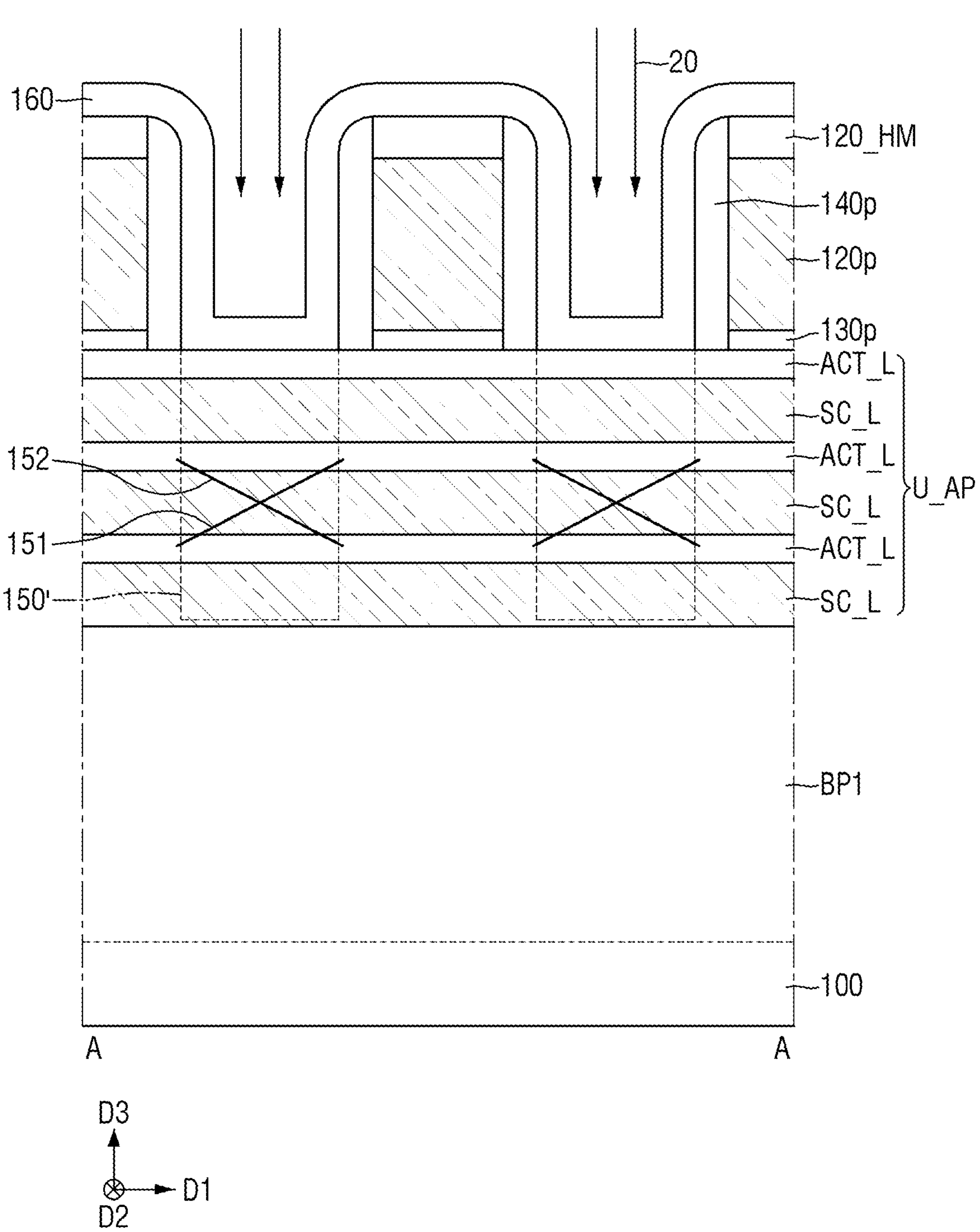

Referring to FIG. 35, the stress film 160 may be formed. Thereafter, the amorphized area 150' may be recrystallized via the annealing process 20 to form a pre-stacking fault 151 and 152. For example, the pre-stacking fault 151 and 152 may extend from a point spaced apart from a sidewall of one active pattern ACT_L or from the sidewall of one active pattern ACT_L in a negative slope or a positive slope.

Figure 36:
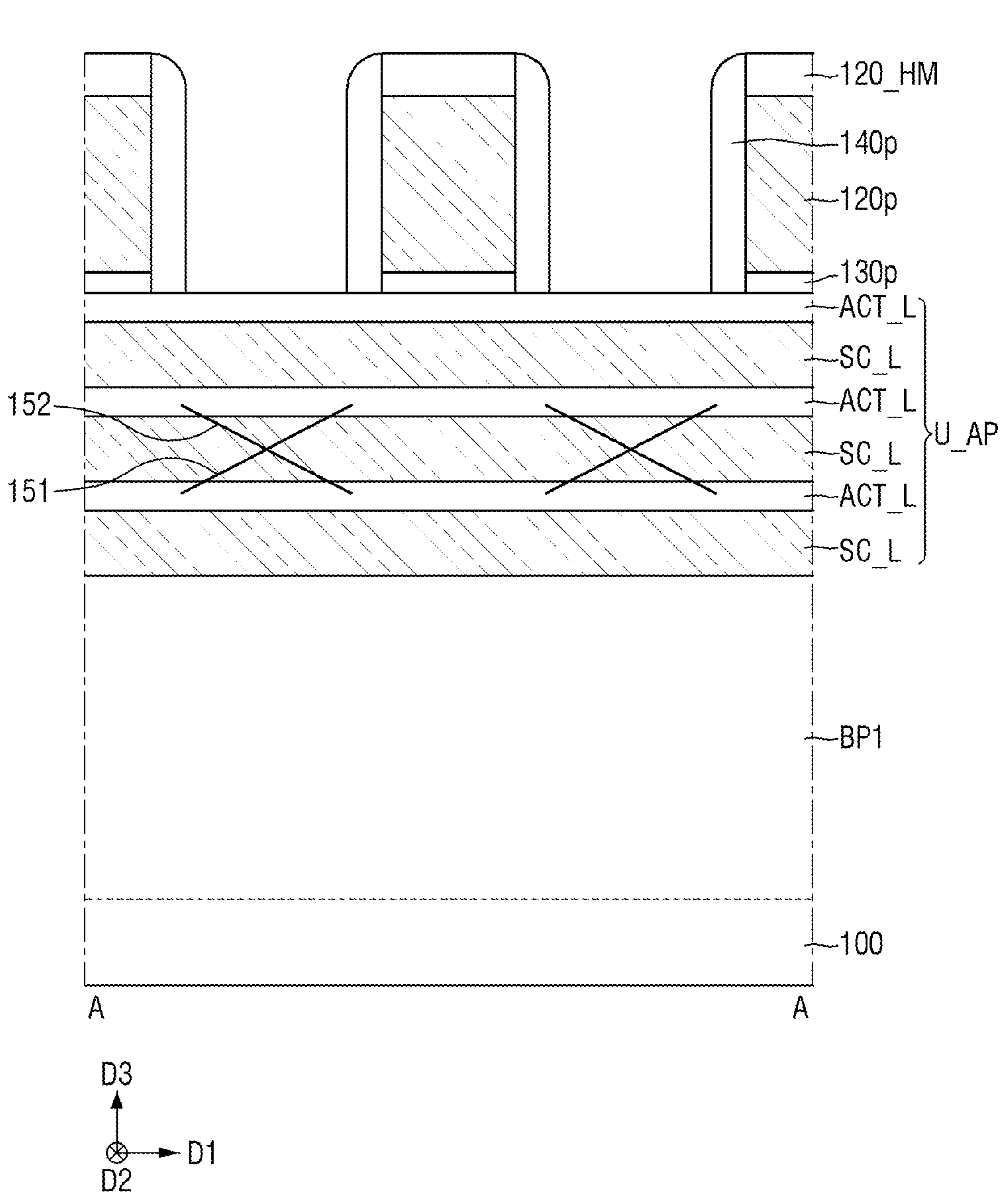

Referring to FIG. 36, the stress film 160 may be removed.

Figure 37:
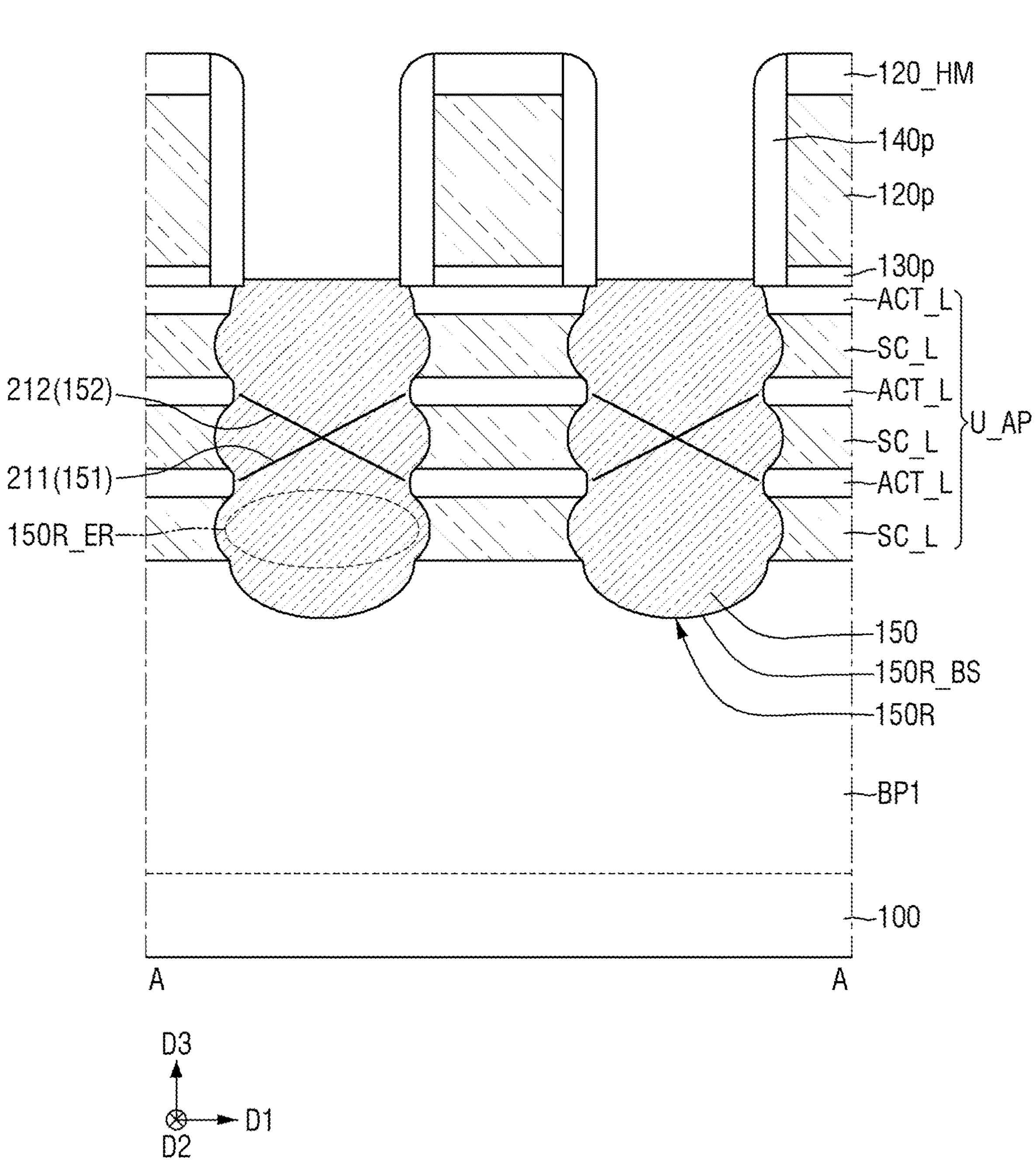

Referring to FIG. 37, using the dummy gate electrode 120*p* as a mask, the first source/drain recess 150R may be formed in the upper pattern structure U_AP. Accordingly, a portion of the pre-stacking fault 151 and 152 may be removed. That is, a starting point or an ending point of the pre-stacking fault 151 and 152 may remain.

Subsequently, the first source/drain pattern 150 filling the first source/drain recess 150R may be formed. The first source/drain pattern 150 may include the first stacking fault 211 and 212. The first stacking fault 211 and 212 may extend from the remaining starting point or ending point of the pre-stacking fault 151 and 152 when forming the first source/drain recess 150R.

By way of summation and review, embodiments provide a semiconductor device with improved product reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

an active pattern including a lower pattern and sheet patterns, the sheet patterns being spaced apart from the lower pattern in a first direction which is a vertical direction;

first and second gate structures on the lower pattern, the first and second gate structures being spaced apart from each other in a second direction which is a horizontal direction;

a source/drain recess between the first and second gate structures, the source/drain recess extending vertically from a first height below a lowermost sheet pattern of the sheet patterns to a second height above an uppermost sheet pattern of the sheet patterns, the lowermost sheet pattern having no additional sheet patterns of the active pattern therebelow; and a source/drain pattern filling the source/drain recess from the first height to the second height, the source/drain pattern including at least one stacking fault spaced apart from the lower pattern, and not including any stacking faults at a height below a height of the lowermost sheet pattern from a bottom surface of the active pattern, wherein the at least one stacking fault extends from a first point overlapping a sidewall of one of the sheet patterns in the second direction toward a top surface of the source/drain pattern or extends from the first point toward a bottom surface of the source/drain recess.

2. The device as claimed in claim 1, wherein the at least one stacking fault is spaced apart from the sheet patterns.

3. The device as claimed in claim 1, wherein the at least one stacking fault is in contact with at least one of the sheet patterns.

4. The device as claimed in claim 1, wherein the at least one stacking fault extends into at least one of the sheet patterns.

5. The device as claimed in claim 1, wherein:

the sheet patterns include a first sheet pattern which is the lowermost sheet pattern, a second sheet pattern, and a third sheet pattern, the first sheet pattern, second sheet pattern, and third sheet pattern sequentially stacked in the first direction, and the at least one stacking fault is a first stacking fault extending between an extension line of a bottom surface of the first sheet pattern and an extension line of a top surface of the second sheet pattern without extending beyond the extension line of the bottom surface of the first sheet pattern and without extending beyond the extension line of the top surface of the second sheet pattern.

6. The device as claimed in claim 1, wherein:

the sheet patterns include a first sheet pattern which is the lowermost sheet pattern, a second sheet pattern, and a third sheet pattern, the first sheet pattern, second sheet pattern, and third sheet pattern sequentially stacked in the first direction, and the at least one stacking fault is a first stacking fault extending between an extension line of a bottom surface of the second sheet pattern and an extension line of a top surface of the third sheet pattern without extending beyond the extension line of the bottom surface of the second sheet pattern and without extending beyond the extension line of the top surface of the third sheet pattern.

7. The device as claimed in claim 1, wherein:

the sheet patterns include a first sheet pattern which is the lowermost sheet pattern, a second sheet pattern, and a third sheet pattern sequentially stacked in the first direction, and the at least one stacking fault is a first stacking fault between an extension line of a bottom surface of the third sheet pattern and the top surface of the source/drain pattern.

8. The device as claimed in claim 1, wherein the source/drain recess includes at least one extension area, a dimension in the second direction of each extension area of the at least one extension area increases and then decreases as the extension area extends away from the lower pattern.

9. The device as claimed in claim 1, wherein each of the first and second gate structures includes an inner spacer between ones of the sheet patterns that are adjacent to each other in the first direction, at least a portion of the source/drain recess being defined by the inner spacer.

10. The device as claimed in claim 1, wherein a dimension in the second direction of the source/drain recess is constant as the source/drain recess extends away from the lower pattern.

11. The device as claimed in claim 1, wherein the at least one stacking fault includes:

a first stacking fault having a positive slope relative to a top surface of the lower pattern; and a second stacking fault having a negative slope relative to the top surface of the lower pattern, the first stacking fault and the second stacking fault being in contact with each other, crossing each other, the first stacking fault extending from a sidewall of a first one of the sheet patterns to a sidewall of a second one of the sheet patterns separated from the first one of the sheet patterns in the second direction, and the second stacking fault extending from a sidewall of a third one of the sheet patterns to a sidewall of a fourth one of the sheet patterns separated from the third one of the sheet patterns in the second direction.

12. A semiconductor device, comprising:

an active pattern including a lower pattern and sheet patterns above the lower pattern, the sheet patterns being spaced apart from the lower pattern in a first direction which is a vertical direction;

a gate structure on the lower pattern, the gate structure surrounding the sheet patterns and extending in a second direction which is a horizontal direction, the gate structure including a gate electrode;

a source/drain recess within the active pattern and on at least one side of the gate structure, the source/drain recess including an extension area between the lower pattern and the sheet patterns or between adjacent ones of the sheet patterns in the first direction, and a dimension in a third direction of the extension area increasing and then decreasing as the extension area extends away from the lower pattern; and a source/drain pattern filling the source/drain recess, the source/drain pattern extending within the source/drain recess vertically from a first height where the lower pattern is located to a second height of an uppermost sheet pattern of the sheet patterns, the source/drain pattern including at least one stacking fault at a vertical height above a vertical height of a top surface of the lower pattern, and the source/drain pattern including no stacking faults at a vertical height below a lowermost sheet pattern of the active pattern, wherein the at least one stacking fault extends from a first point overlapping a sidewall of one of the sheet patterns in the third direction toward a top surface of the source/drain pattern or extends from the first point toward a bottom surface of the source/drain recess.

13. The device as claimed in claim 12, wherein the sheet patterns include a first sheet pattern, a second sheet pattern, and a third sheet pattern sequentially stacked in the first direction, and wherein:

the at least one stacking fault includes a first stacking fault that extends from a sidewall of the first sheet pattern or from a point spaced apart from the sidewall of the first sheet pattern in the third direction in an inclined manner toward the top surface of the source/drain pattern, or the at least one stacking fault includes a second stacking fault that extends from a sidewall of the second sheet pattern or from a point spaced apart from the sidewall of the second sheet pattern in the third direction in an inclined manner toward a bottom surface of the source/drain recess.

14. The device as claimed in claim 12, wherein the sheet patterns include a first sheet pattern, a second sheet pattern, and a third sheet pattern sequentially stacked in the first direction, and wherein:

the at least one stacking fault includes a first stacking fault that extends from a sidewall of the second sheet pattern or from a point spaced apart from the sidewall of the second sheet pattern in the third direction in an inclined manner toward the top surface of the source/drain pattern, or the at least one stacking fault includes a second stacking fault that extends from a sidewall of the third sheet pattern or from a point spaced apart from the sidewall of the third sheet pattern in the third direction in an inclined manner toward the bottom surface of the source/drain recess.

15. The device as claimed in claim 12, wherein:

the sheet patterns include a first sheet pattern, a second sheet pattern, and a third sheet pattern sequentially stacked in the first direction, and the at least one stacking fault includes a first stacking fault that extends from a sidewall of the third sheet pattern or from a point spaced apart from the sidewall of the third sheet pattern in the third direction in an inclined manner toward the top surface of the source/drain pattern.

16. The device as claimed in claim 12, wherein the at least one stacking fault includes a first stacking fault that extends from a sidewall of the gate structure or from a point spaced from the sidewall of the gate structure in the third direction in an inclined manner toward the top surface of the source/drain pattern or the bottom surface of the source/drain recess.

17. The device as claimed in claim 12, wherein the at least one stacking fault extends into at least one of the sheet patterns.

18. The device as claimed in claim 12, wherein the gate structure further includes an inner spacer in the extension area.

19. The device as claimed in claim 12, wherein the source/drain recess is a first source/drain recess on a first side of the gate structure and the source/drain pattern is a first source/drain pattern filling the first source/drain recess, and further comprising a second source/drain recess on a second side of the gate structure and a second source/drain pattern filling the second source/drain recess, wherein the at least one stacking fault includes a first stacking fault in the first source/drain pattern and a second stacking fault in the second source/drain pattern, the first stacking fault including a first-first stacking fault and a first-second stacking fault crossing each other, and the second stacking fault including a second-first stacking fault and a second-second stacking fault not crossing each other but meeting each other.

20. A semiconductor device, comprising:

a first active pattern including a first lower pattern and first sheet patterns above the first lower pattern, the first sheet patterns being spaced apart from the first lower pattern in a first direction which is a vertical direction;

a second active pattern including a second lower pattern and second sheet patterns, the second sheet patterns being spaced apart from the second lower pattern in the first direction;

a first gate structure on the first lower pattern and disposed to include a portion between the first lower pattern and the first sheet patterns, the first gate structure surrounding the first sheet patterns and extending in a second direction;

a second gate structure on the second lower pattern and disposed to include a portion between the second lower pattern and the second sheet patterns, the second gate structure surrounding the second sheet patterns and extending in the second direction;

a first source/drain recess in the first active pattern and on at least one side of the first gate structure;

a second source/drain recess in the second active pattern and on at least one side of the second gate structure;

a first source/drain pattern filling the first source/drain recess, the first source/drain pattern including a stacking fault at a height above a height of the first lower pattern, and not including any stacking faults at the height of the portion of the first gate structure between the first lower pattern and the first sheet pattern; and a second source/drain pattern filling the second source/drain recess, wherein the stacking fault extends from a first point overlapping a sidewall of one of the first sheet patterns in a third direction toward a top surface of the first source/drain pattern or extends from the first point toward a bottom surface of the first source/drain recess.

* * * * *